United States Patent
Yang

(10) Patent No.: US 9,082,802 B2
(45) Date of Patent: Jul. 14, 2015

(54) WAFER CENTERING HARDWARE DESIGN AND PROCESS

(75) Inventor: Chin Cheng Yang, Kaohsiung County (TW)

(73) Assignee: MACRONIX INTERNATIONAL CO., LTD. (TW)

(*) Notice: Subject to any disclaimer, the term of this patent is extended or adjusted under 35 U.S.C. 154(b) by 505 days.

(21) Appl. No.: 13/305,710

(22) Filed: Nov. 28, 2011

(65) Prior Publication Data

US 2013/0138238 A1 May 30, 2013

(51) Int. Cl.
| | |
|---|---|
| G06F 19/00 | (2011.01) |
| H01L 21/68 | (2006.01) |
| H01L 21/67 | (2006.01) |
| G05B 23/02 | (2006.01) |

(52) U.S. Cl.
CPC .......... *H01L 21/681* (2013.01); *H01L 21/6715* (2013.01); *G05B 23/02* (2013.01)

(58) Field of Classification Search
CPC .................. H01L 21/67796; H01L 21/67739; G05B 23/02
USPC ......................... 700/121, 114; 33/520; 438/16
See application file for complete search history.

(56) References Cited

U.S. PATENT DOCUMENTS

| | | | | |
|---|---|---|---|---|
| 5,822,213 | A * | 10/1998 | Huynh | 700/213 |
| 6,521,548 | B2 * | 2/2003 | Jeng | 438/782 |
| 6,548,115 | B1 * | 4/2003 | Gibson et al. | 427/282 |
| 7,413,963 | B2 * | 8/2008 | Huang et al. | 438/448 |
| 7,495,757 | B2 * | 2/2009 | Kim | 356/237.1 |
| 7,497,026 | B2 * | 3/2009 | Herchen et al. | 33/550 |
| 7,508,504 | B2 * | 3/2009 | Jin et al. | 356/237.4 |
| 2005/0048760 | A1 * | 3/2005 | Wu | 438/622 |
| 2005/0284369 | A1 * | 12/2005 | Miya et al. | 118/500 |
| 2006/0292714 | A1 * | 12/2006 | Kim | 438/16 |
| 2008/0030731 | A1 * | 2/2008 | Jin et al. | 356/369 |
| 2008/0168673 | A1 * | 7/2008 | Herchen et al. | 33/550 |
| 2009/0116727 | A1 * | 5/2009 | Jin et al. | 382/149 |
| 2009/0122304 | A1 * | 5/2009 | Jin et al. | 356/237.4 |

* cited by examiner

*Primary Examiner* — Michael D Masinick
(74) *Attorney, Agent, or Firm* — Baker & McKenzie LLP

(57) ABSTRACT

An apparatus, system, or method for positioning a wafer on a support of a rotatable chuck may improve the accuracy and precision of various wafer edge cuts and wafer profiling at a variety of stages of wafer manufacturing. The apparatus, system, or and/or method may employ one or more of a wafer position calculator to calculate a desired wafer position and to provide desired wafer position information to a wafer arm controller; and a wafer arm controller in communication with the wafer position calculator to provide instructions to adjust a wafer arm to position the wafer on the support according to the desired wafer position. Various sensor detectors and sensor lights or other mechanisms for sensing the position of a wafer may also be used.

25 Claims, 23 Drawing Sheets

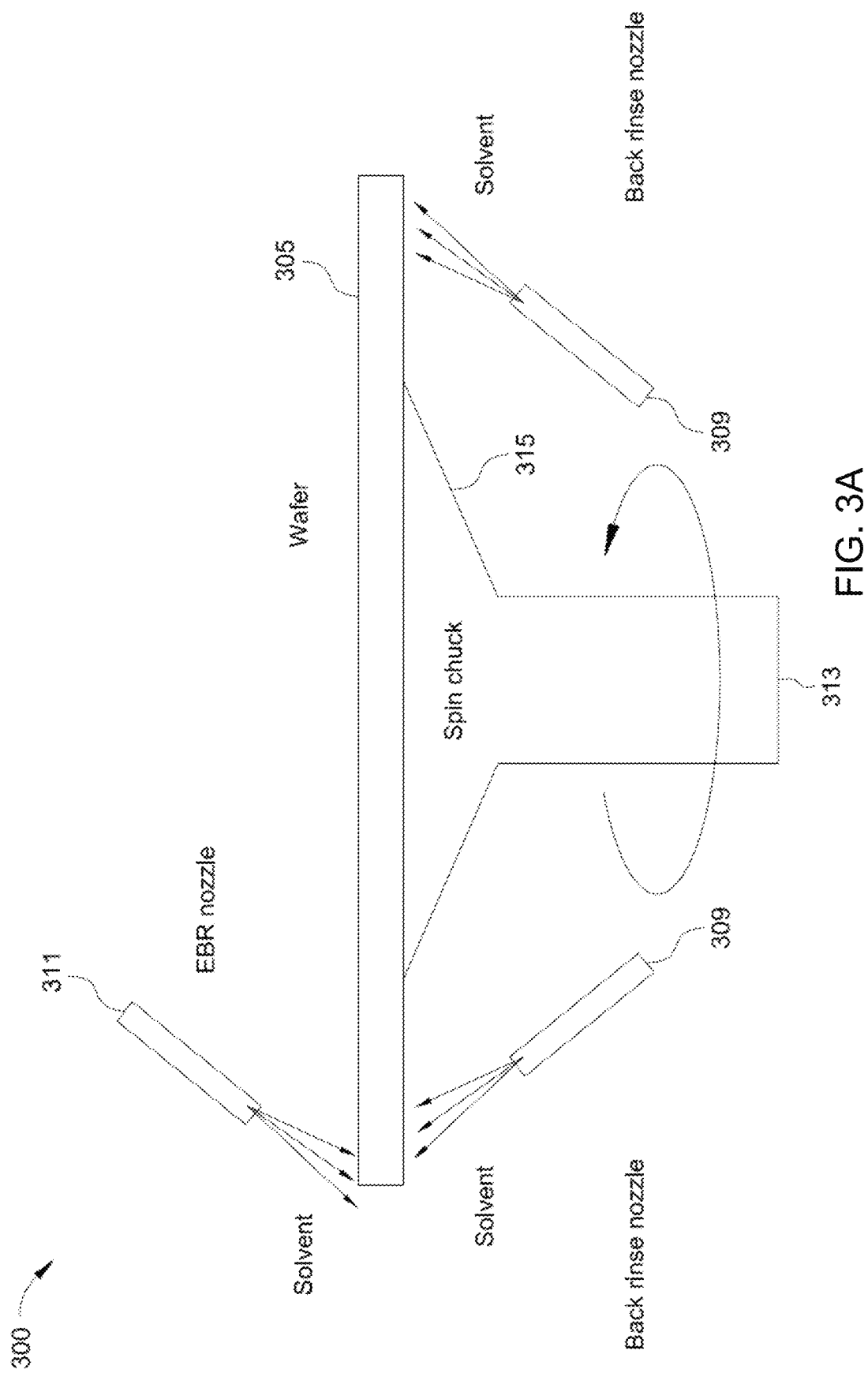

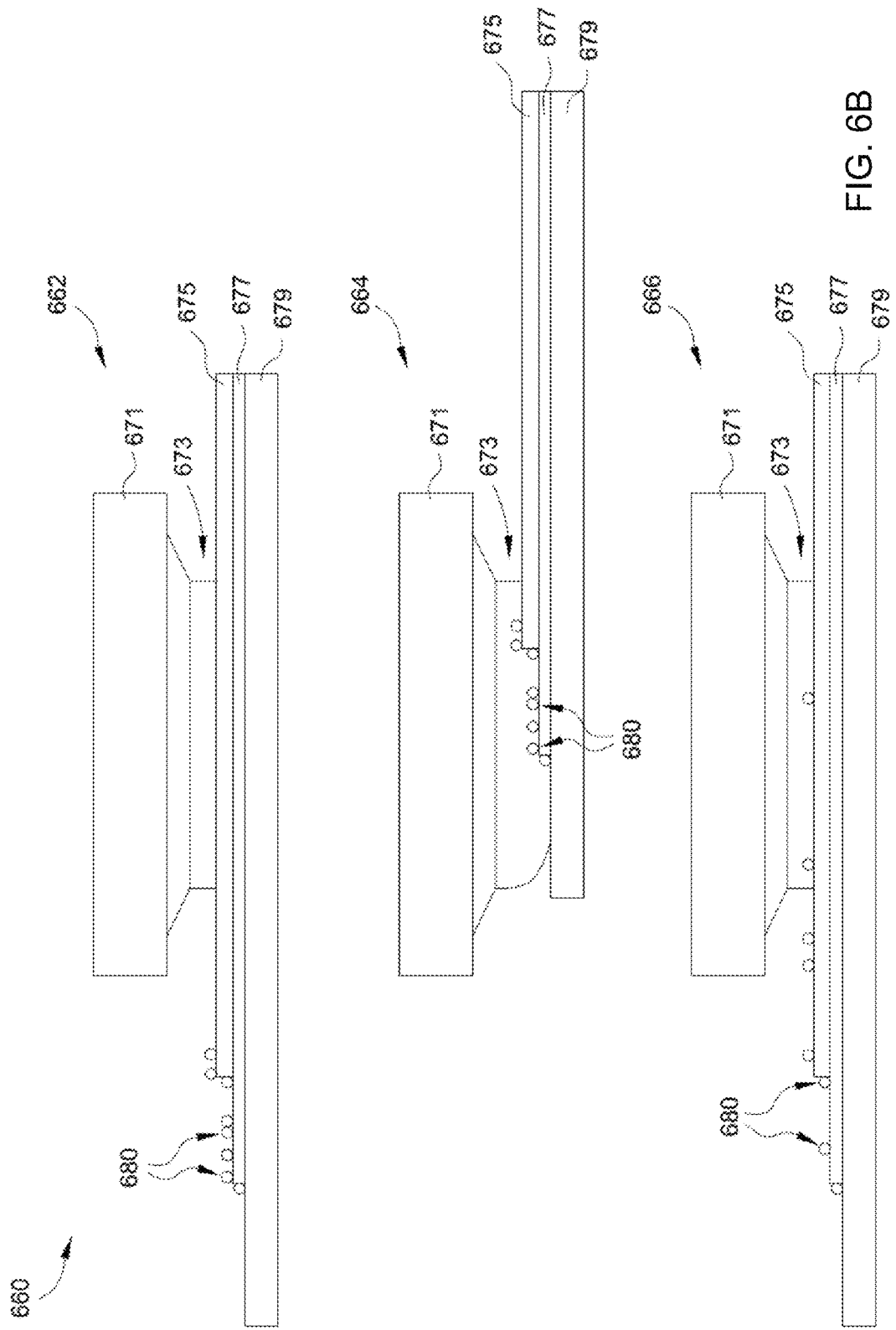

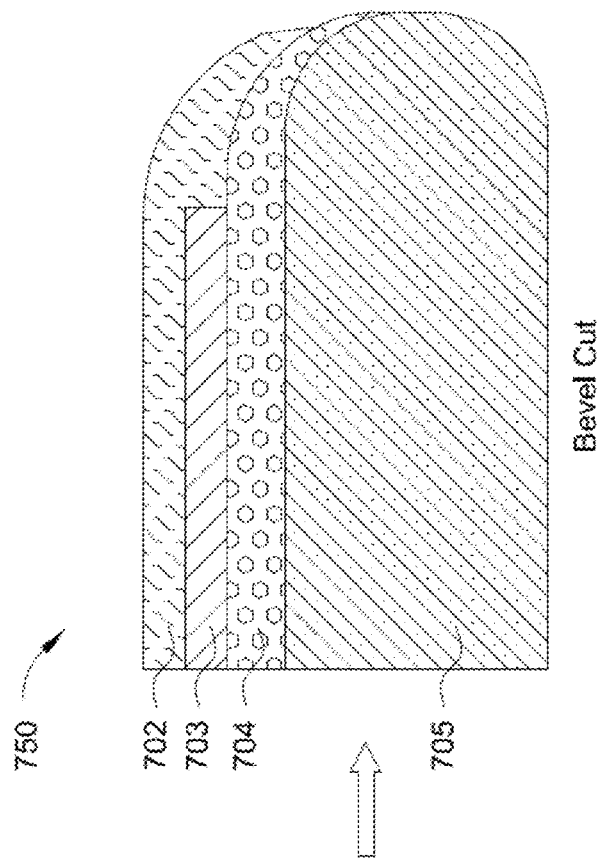
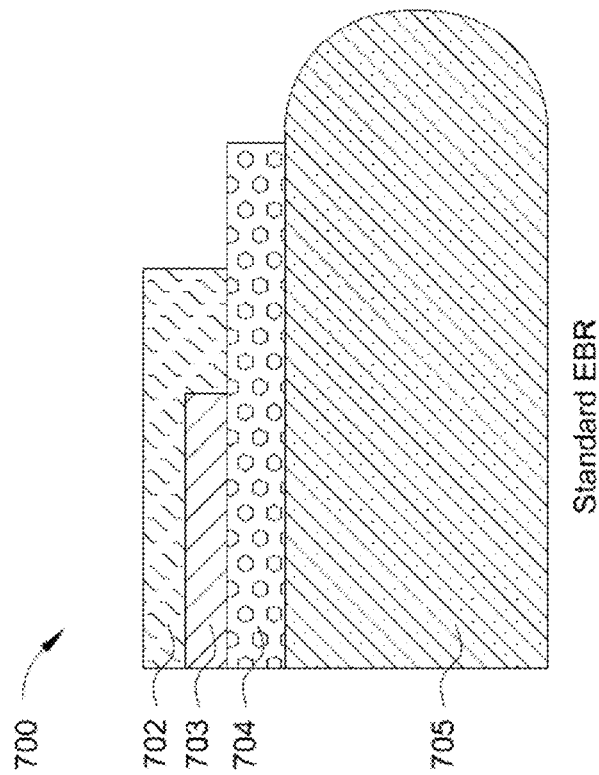
FIG. 7B
FIG. 7A

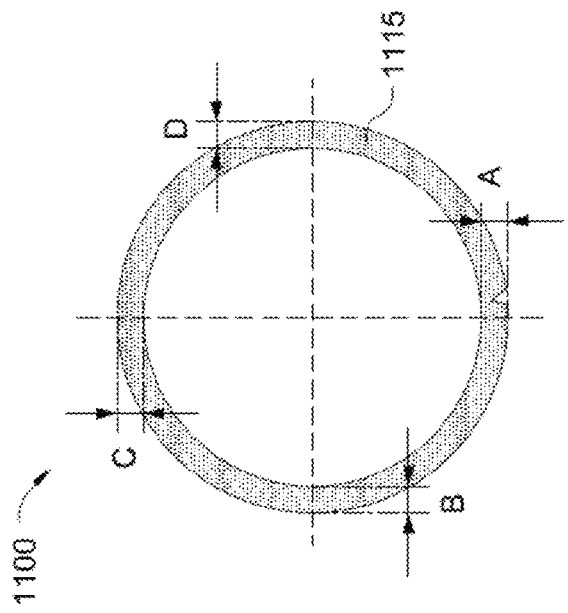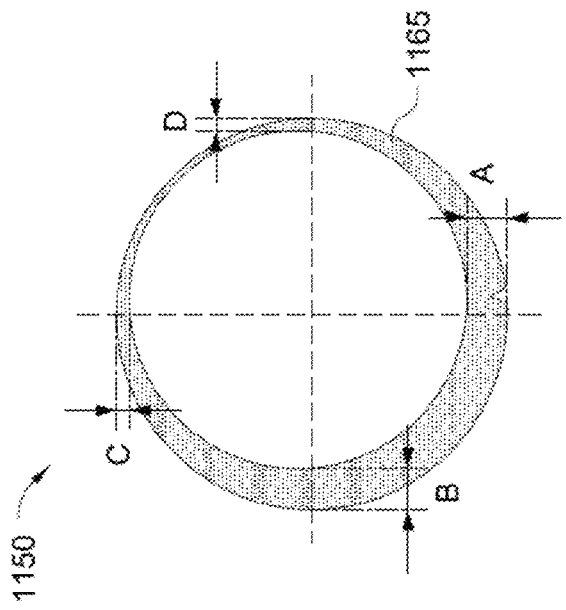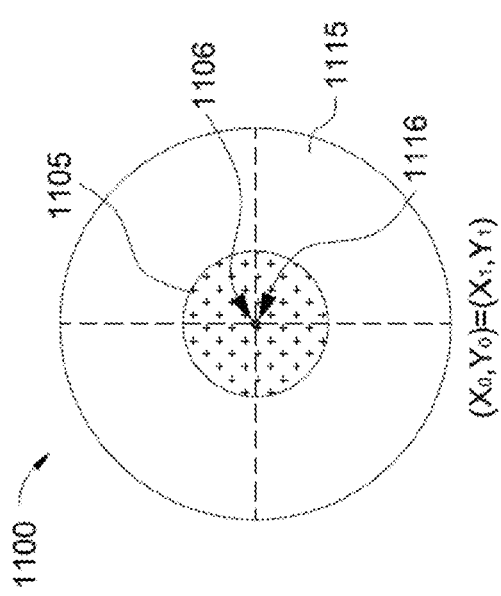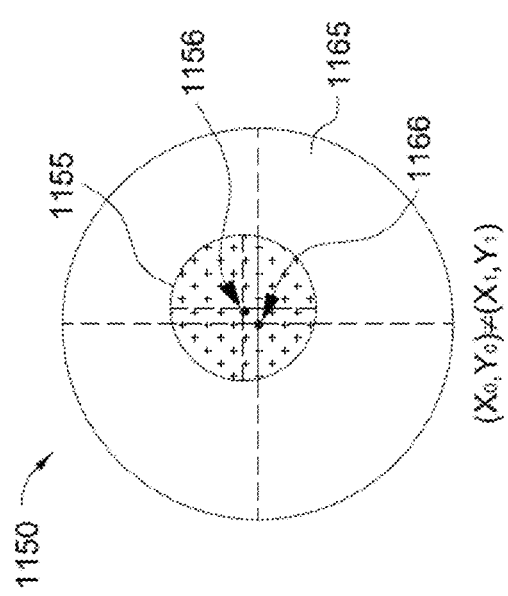
FIG. 11A
FIG. 11B

WAFER CENTERING HARDWARE DESIGN AND PROCESS

BACKGROUND

1. Technical Field

The present application relates generally to enhancing semiconductor wafer manufacturing and, more specifically, relates to positioning a semiconductor wafer with respect to the position of a support of a rotatable chuck to enhance wafer bevel edge bead removal (EBR) accuracy and reduce asymmetrical application of photo resist on a wafer during semiconductor wafer manufacturing.

2. Related Art

Photo resist layers are widely used in modern integrated circuit processing. A photo resist layer is applied to a semiconductor wafer by flowing a photo resist liquid onto a wafer while spinning the wafer.

FIG. 1 is a schematic diagram illustrating a photo resist spin coating process 100. A wafer has been positioned on a support of a rotatable chuck. Early in the spin coating process 100, photo resist is dispensed onto the wafer at action 101. Photo resist is spread over the wafer while the support (and the wafer resting on the support) begins to spin at action 103. At action 105, the support and wafer continue to spin as the layer of photo resist becomes thinner. At action 107, some photo resist solvent is evaporated during the spinning. At action 109, edge bead removal (EBR) and backside rinse processes begin.

FIG. 2 is a schematic diagram 200 illustrating a wafer 205 prior to undergoing edge bead removal (EBR) and backside rinse processes. The wafer 205 has a photo resist layer 203, and the spin coating process has resulted in edge beads 201 of photo resist at the edges of wafer 205. Further, backside contamination 207 has formed on the backside of the wafer 205. The edge beads 201 and backside contamination 207 are caused by air flow patterns 250 during the spin coating process.

FIG. 3A is a schematic diagram illustrating a conventional apparatus 300 for removing edge beads and backside contamination. A wafer 305 is positioned on a spin chuck 313 having a support 315. Edge bead removal (EBR) nozzle 311 and backside rinse nozzles 309 are positioned above and below the spin chuck support and are used to remove the edge beads and backside contamination.

FIG. 3B is a schematic diagram illustrating a close up view of edge bead removal (EBR) processes 350. An edge bead removal (EBR) nozzle 311 is used to remove a layer of photo resist 303 at the edge of a wafer 305. Process 350 shows that the edge bead removal (EBR) nozzle 311 is moved back and forth in a laterally or horizontally to remove a the photo resist 303 at the edge of the wafer 305. The positioning of the wafer 305 with respect to the edge bead removal (EBR) nozzle 311 often results in variations in edge bead removal (EBR) cut widths at the edges of the wafer 305.

Recent manufacturing processes require a high level of precision of the wafer edge cut, and the wafer edge profile is becoming more important both at the immersion lithography stages of wafer manufacturing and during pre-layer profiling. Thus, it is desirable to find new approaches for improving the accuracy and precision of various wafer edge cuts and wafer profiling at a variety of stages of wafer manufacturing.

SUMMARY

Disclosed herein are methods and systems for positioning a wafer on a support of a rotatable chuck.

According to an aspect, an apparatus for positioning a wafer on a support of a rotatable chuck includes a sensor light positioned proximate to the rotatable chuck, a sensor detector positioned proximate to the rotatable chuck. The sensor detector is operable to determine wafer position information.

The apparatus may also include a wafer position calculator in communication with the sensor detector. The wafer position calculator may be operable to calculate the position of the wafer based on wafer position information received from the sensor detector. The wafer position calculator may also be operable to calculate a desired wafer position based on rotatable chuck coordinate information.

The apparatus may also include a wafer arm and a wafer arm controller in communication with the wafer position calculator. The wafer arm controller is operable to adjust the wafer arm to position the wafer with respect to the support. The wafer arm controller may also be operable to adjust the wafer arm to position a center coordinate of the wafer in alignment with a center coordinate of the support.

The wafer position calculator may provide desired wafer position information to the wafer arm controller. And the desired wafer position information may include wafer arm adjustments based on the desired wafer position.

The sensor light may be positioned opposite the support from the sensor detector or on the same side of the support as the sensor detector. The sensor detector and sensor light may be housed within a single sensor unit or in separate units.

The apparatus may further include a mirror positioned opposite the support from the single sensor unit. The mirror is operable to reflect light produced by the sensor light to the sensor detector.

According to another aspect, a method for positioning a wafer on a support of a rotatable chuck includes receiving wafer position information from a sensor detector, determining wafer position based on the wafer position information, calculating a desired wafer position based on rotatable chuck coordinate information, and providing desired wafer position information to a wafer arm controller operable to adjust the wafer arm to position the wafer on the support according to the desired wafer position.

The method may also include providing instructions for a wafer arm controller to pick up the wafer, providing instructions for the wafer arm controller to transfer the wafer to a position above the support of the rotatable chuck, and providing instructions for the wafer arm controller to lower the wafer onto the support.

The method may also include providing instructions for securing the wafer to the support with support pins, initiating a photo resist coating process, initiating an edge bevel rinse process, and providing instructions for the wafer arm controller to remove the wafer from the support.

The wafer position calculator may be operable to calculate the position of the wafer based on wafer position information received from the sensor detector. And calculating the desired wafer position may include determining desired coordinates of a central axis of the wafer.

Providing desired wafer position information may include providing two-dimensional adjustment information. And the two-dimensional adjustment information may include $(X_0, Y_0)$-$(X_1, Y_1)$. $(X_0, Y_0)$ is a two-dimensional representation of coordinates of a central axis of the wafer position, and $(X_1, Y_1)$ is a two-dimensional representation of central coordinates of a central axis of the support of the rotatable chuck.

According to another aspect, a system for positioning a wafer on a support of a rotatable chuck includes a wafer position calculator operable to calculate a desired wafer position and provide desired wafer position information to a wafer arm controller. The system may also include a wafer arm controller in communication with the wafer position calculator. The wafer arm controller may be operable to provide instructions to adjust a wafer arm to position the wafer on the support according to the desired wafer position.

The system may also include a sensor detector and a sensor light. The sensor detector is in communication with the wafer position calculator, and the sensor detector provides wafer position information to the wafer position calculator.

The wafer position calculator of the system may receive wafer position information from a sensor detector, and the wafer position calculator may operable to determine wafer position based on the wafer position information. The desired wafer position information may be provided to the wafer arm controller including two-dimensional adjustment information. The two-dimensional adjustment information may include $(X_0,Y_0)$-$(X_1,Y_1)$. $(X_0,Y_0)$ is a two-dimensional representation of coordinates of a central axis of the wafer position, and $(X_1,Y_1)$ is a two-dimensional representation of central coordinates of a central axis of the support of the rotatable chuck.

BRIEF DESCRIPTION OF THE DRAWINGS

Features, aspects, and embodiments of the inventions are described in conjunction with the attached drawings, in which:

FIG. 3A is a schematic diagram illustrating a conventional apparatus for removing edge beads and backside contamination;

FIGS. 6A and 6B are schematic diagrams illustrating possible sources of wafer defects and their impact during immersion exposure, in accordance with the present disclosure;

FIGS. 7A and 7B are schematic diagrams illustrating an edge bead removal (EBR) approach and a bevel rinse approach, in accordance with the present disclosure;

FIGS. 11A and 11B are schematic diagrams illustrating the wafer asymmetries, in accordance with the present disclosure;

DETAILED DESCRIPTION

Figure 1:
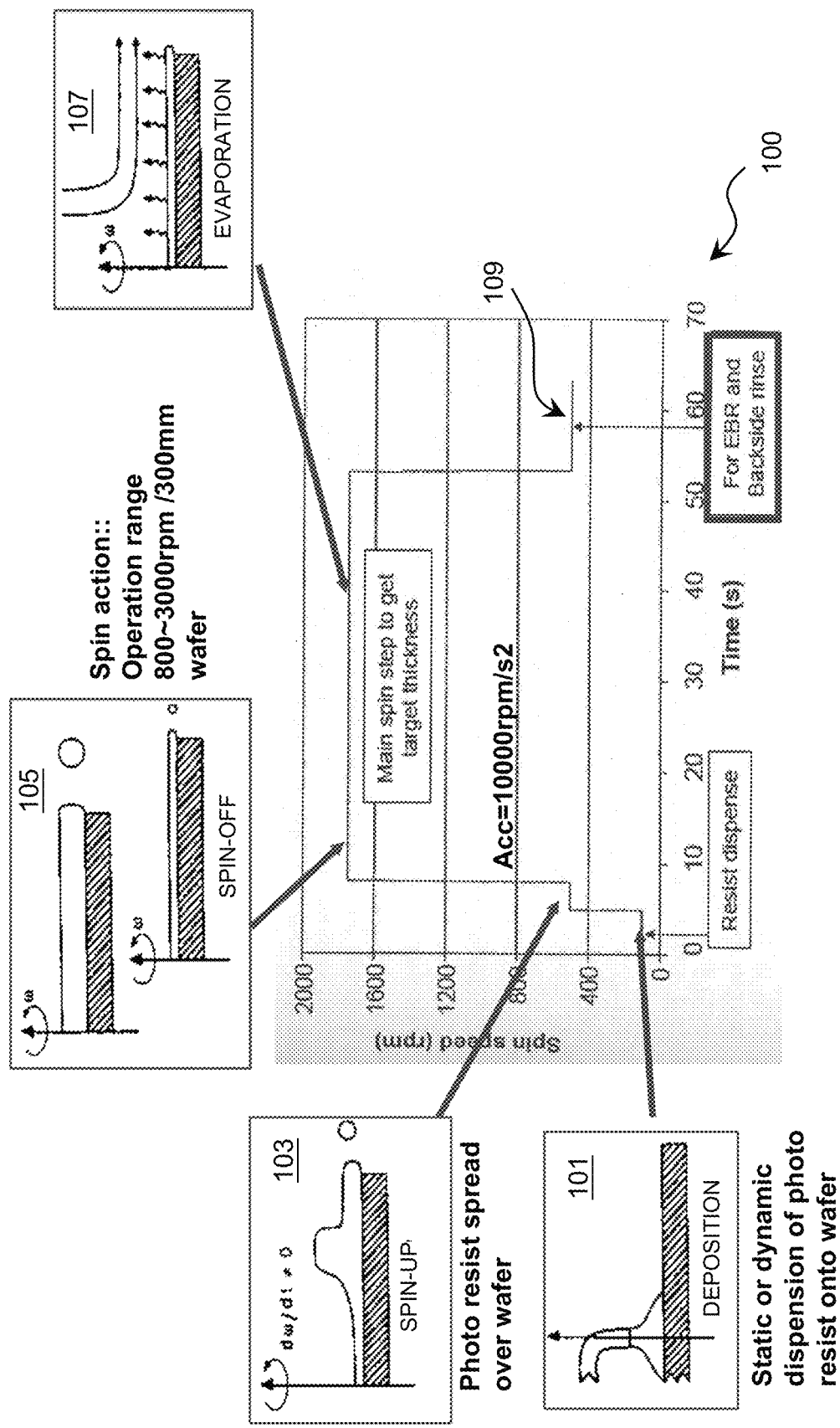
FIG. 1 is a schematic diagram illustrating a photo resist spin coating process.
Figure 2:
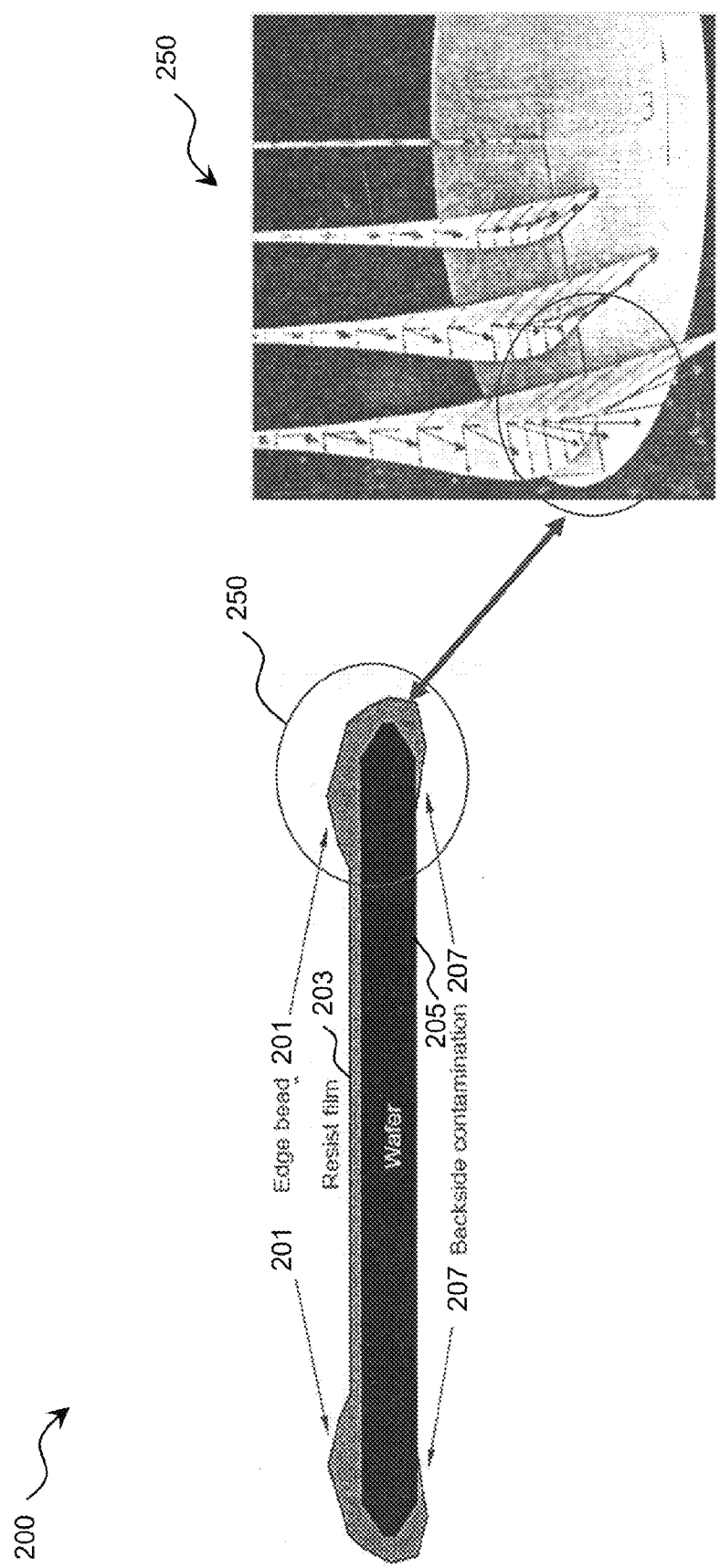
FIG. 2 is a schematic diagram illustrating a wafer prior to undergoing edge bead removal (EBR) and backside rinse processes.
Figure 3B:
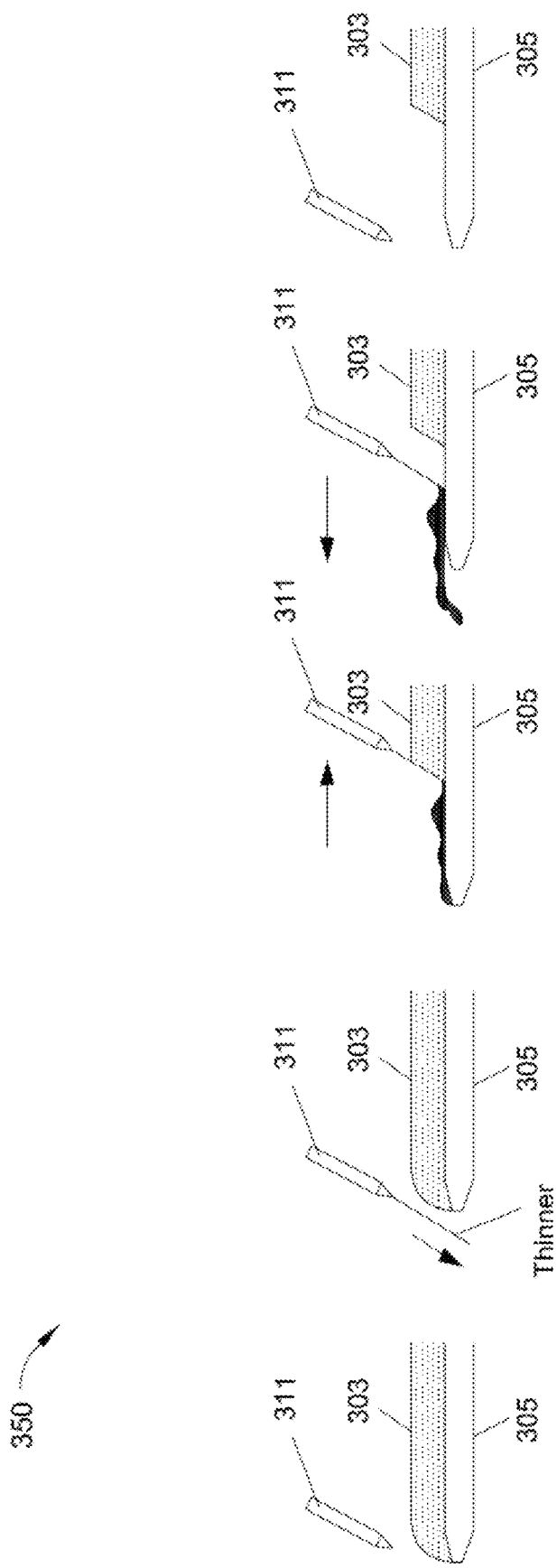
FIG. 3B is a schematic diagram illustrating a close up view of edge bead removal (EBR) processes.
Figure 4B:
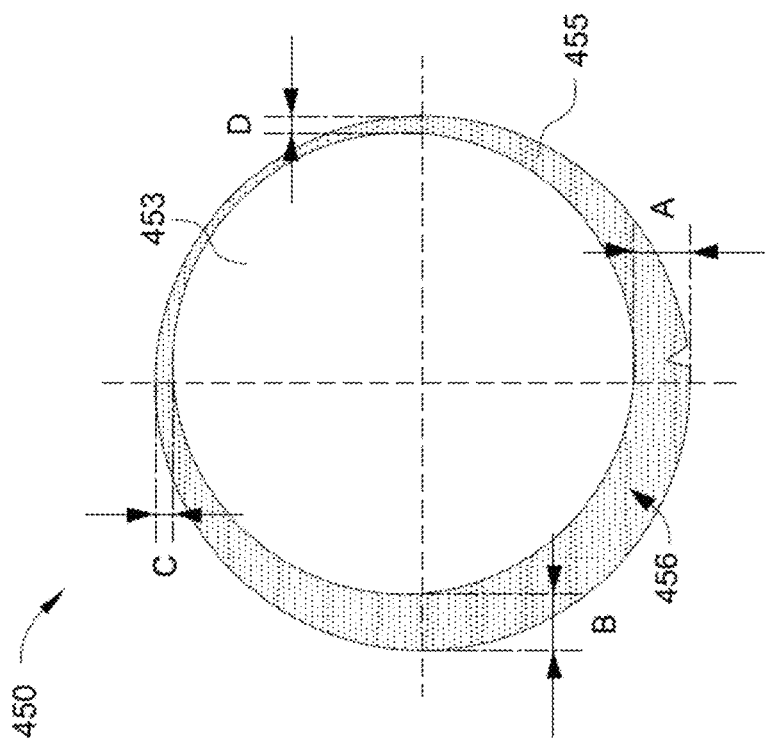
FIGS. 4A and 4B are a schematic top-down diagrams illustrating variations in edge bead removal (EBR) cut widths, in accordance with the present disclosure.
Figure 4A:
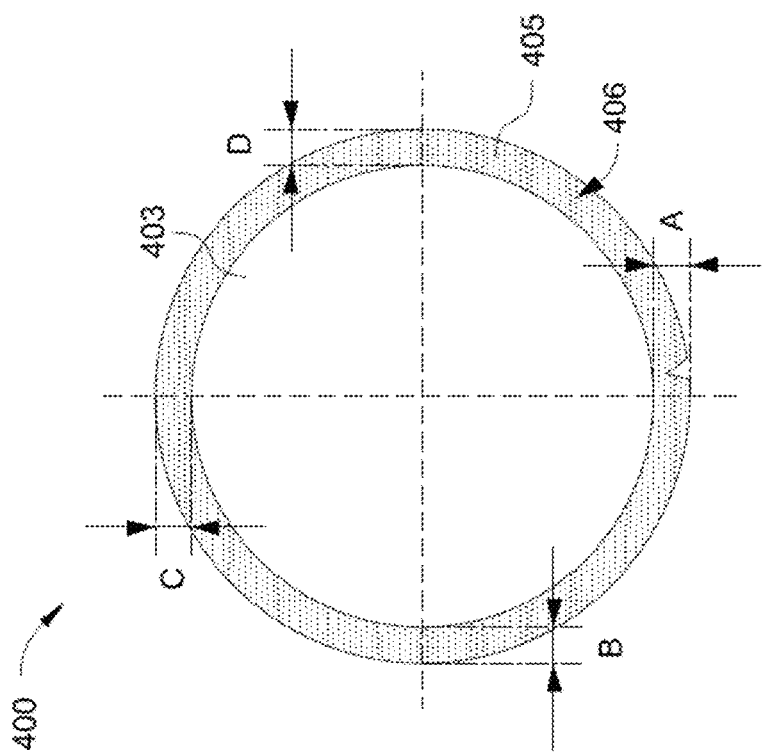

FIGS. 4A and 4B are a schematic top-down diagrams 400, 450 illustrating variations in edge bead removal (EBR) cut widths. Wafer 405 was positioned at its expected alignment on a support. As is shown by EBR cut widths 400 A, B, C, and D, the edge 406 of the wafer 405 without photo resist 403 is approximately even around the wafer 405. Accordingly, wafer 405 has an approximately even distribution of photo resist 403. In contrast, wafer 455 was positioned slightly askew from its expected alignment on a support. As is shown by EBR cut widths 450 A, B, C, and D, the edge 456 of the wafer 455 without photo resist 453 is not even around the wafer 455. Cut width 450 A is larger than B, which is larger than D, which is larger than C. Accordingly, wafer 455 has an asymmetric distribution of photo resist 453.

Figure 5:
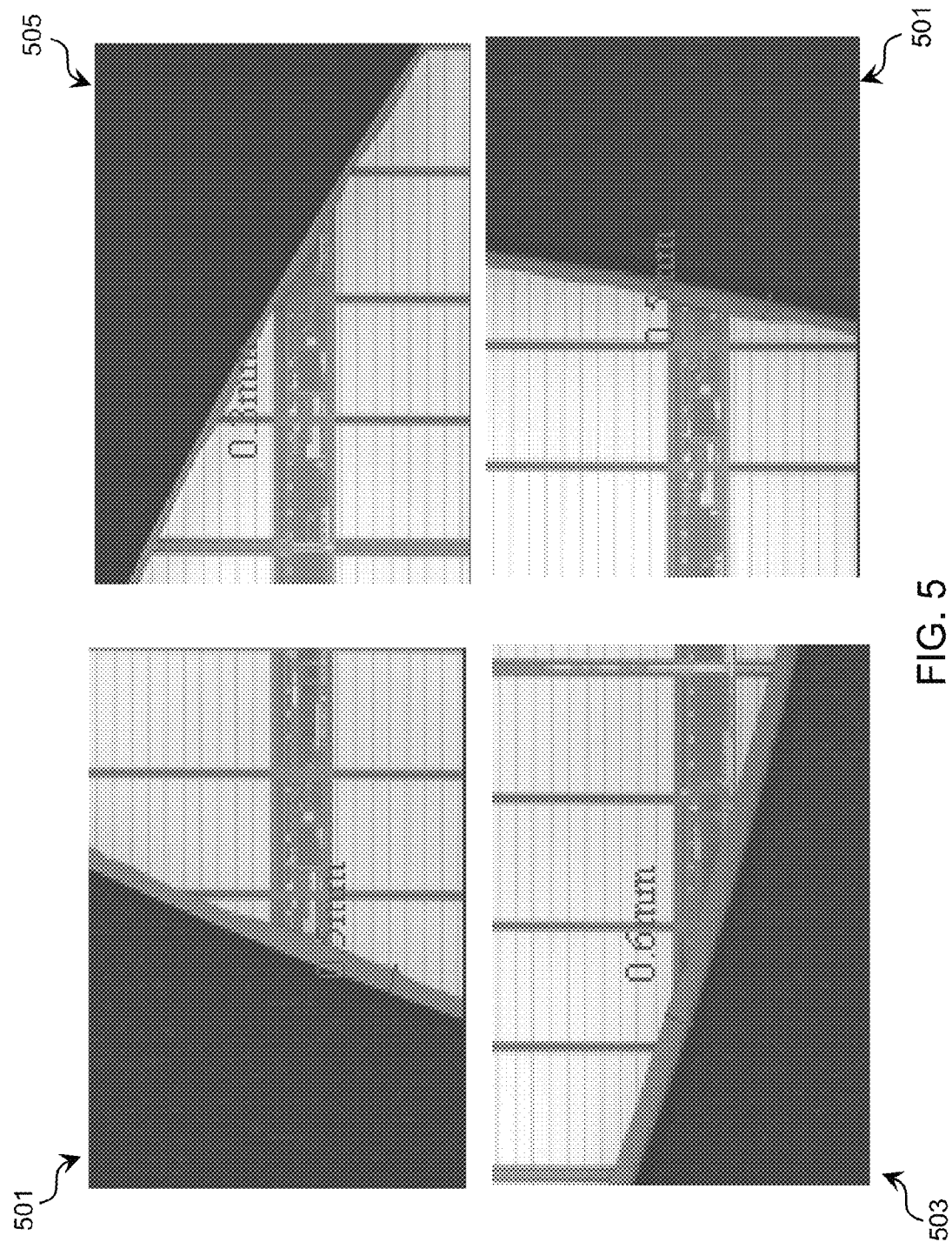
FIG. 5 is a schematic top-town diagram illustrating variations in cut widths around a wafer edge, in accordance with the present disclosure.

FIG. 5 is a schematic top-town diagram illustrating variations in cut widths around a wafer edge. Views 501 show an approximately 0.5 mm cut widths at the edge of a wafer. Views 503, 505 show larger and smaller cut widths.

A variety of defects may occur near the edge of a wafer throughout wafer manufacturing, and such defects can be damaging to the entire wafer during immersion lithography phases of manufacturing and ultimately may affect the effectiveness and yield of the semiconductor wafer process. For example, FIGS. 6A and 6B are schematic diagrams illustrating possible defect sources during wafer manufacturing.

Figure 6A:
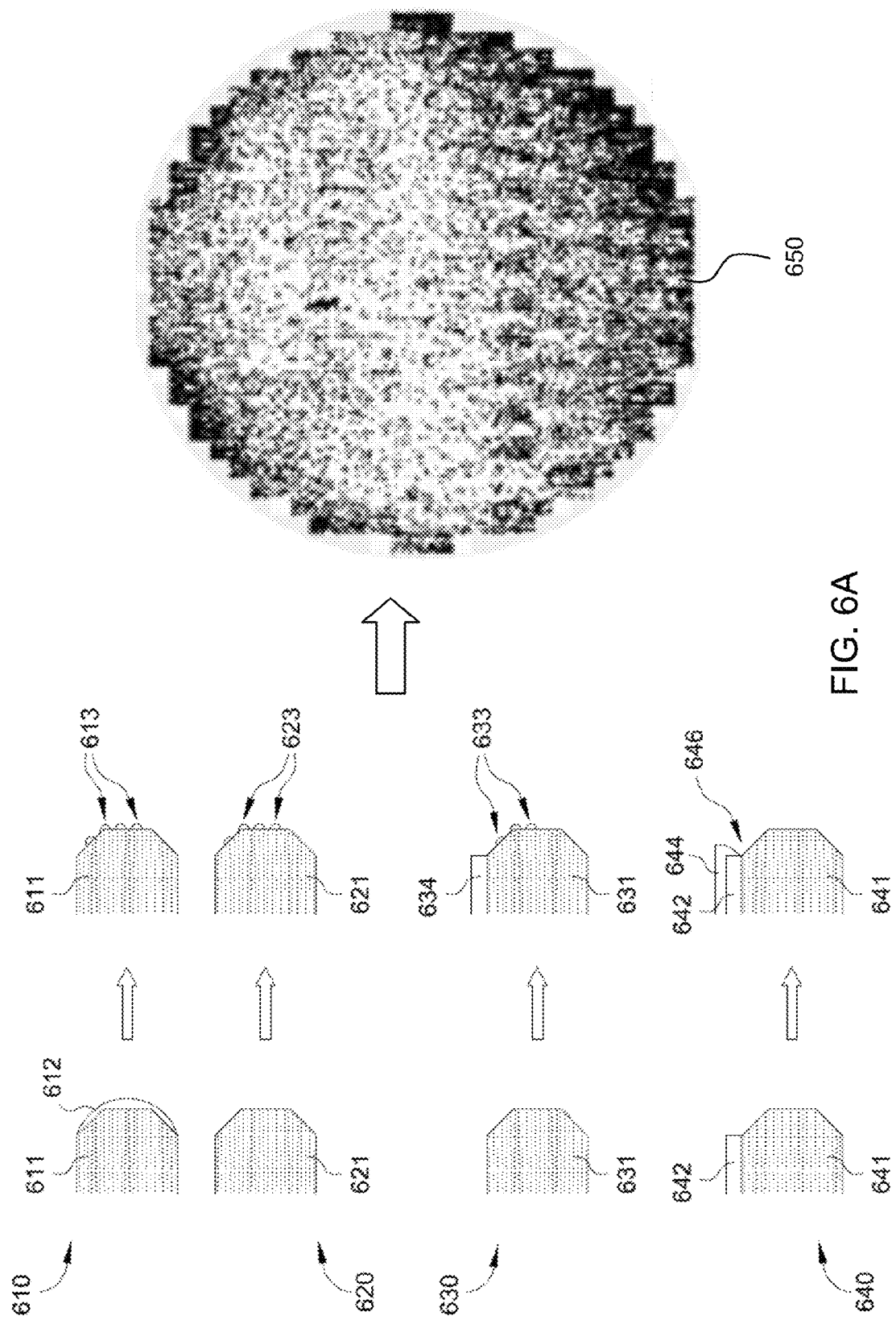

Referring first to FIG. 6A, defect sources 610, 620, 630, 640 are shown. A first source 610 of possible defects may come from immersion exposure processes. A wafer 611 may have film 612 remaining from a previous fabricating process on the wafer backside and at the wafer bevel. The film 612 may crack or become brittle during subsequent processing, resulting in edge defect particles 613 at the edge of the wafer. A second source 620 of possible defects may come from a front opening universal pod (FOUP) for the wafers 621. The front opening universal pod (FOUP) may contain dirty particles 623, which may then become attached to the wafers 621 inside of the FOUP. A third source 630 of possible defects may come from various coating process failures. A wafer 631 may undergo a coating process, ideally resulting in a coating layer 634. But stray particles 633 of the coating material may attach to the wafer 631 at the bevel edge, resulting in defective particles at the edge of the wafer 631. A fourth source 640 of possible defects may come from topcoat peeling. A topcoat 644 may be applied to the wafer 641 over another coating layer 642. The topcoat may peel 646, causing irregularities at the wafer 641 edge. Any one of these defects results in an uneven and irregular wafer edge 650. And such defects can impact the effectiveness and yield of the semiconductor wafer manufacturing process.

Referring now to FIG. 6B, edge defects 680 migrate to other parts of a wafer 677 during an immersion lithography process 660. Immersion lithography processes 660 refer to a technology in which lithographic exposure is applied to a wafer 677 coated with resist 675 via purified water 673 that is introduced between a scanner lens 671 of a semiconductor exposure system and the wafer 677. An exposure stage 679 moves with respect to a scanner lens 671, causing the wafer 677, which is resting on the exposure stage 679, to move with respect to the scanner lens 671. As the wafer 677 moves with respect to the scanner lens 671 (various positions shown by 662, 664, 666), edge defect particle 680 may migrate to the center of the wafer 677. Thus, when the exposure stage 679 moves with respect to the scanner lens 671, i.e., from a position shown at 664 to a position shown at 666, the edge defect particles 680 may also move toward the center of the wafer 677 damaging and contaminating the center portion of the wafer 677.

Further, various approaches are currently being used to address particle defects at the edge of a wafer during various stages of wafer manufacturing including, but not limited to, a bevel cut approach, using a top coat process, and various shapes and profile designs for the various layers.

For example, FIGS. 7A and 7B are schematic diagrams illustrating a conventional edge bead removal (EBR) approach 700 and a bevel rinse approach 750. The conventional edge bead removal (EBR) approach includes a wafer 705, bottom anti-reflective coating (BARC) layer 704, photo resist layer 703, and top coat layer 702. With a conventional edge bead removal (EBR) approach, layers are removed and a stair-step profile results at the edge of the wafer. The bevel rinse approach 750 also includes a wafer 705, bottom anti-reflective coating (BARC) layer 704, photo resist layer 703, and top coat layer 702. With a bevel rinse approach 750, layers are removed and a smooth, beveled profile results at the edge of the wafer.

Figure 8:
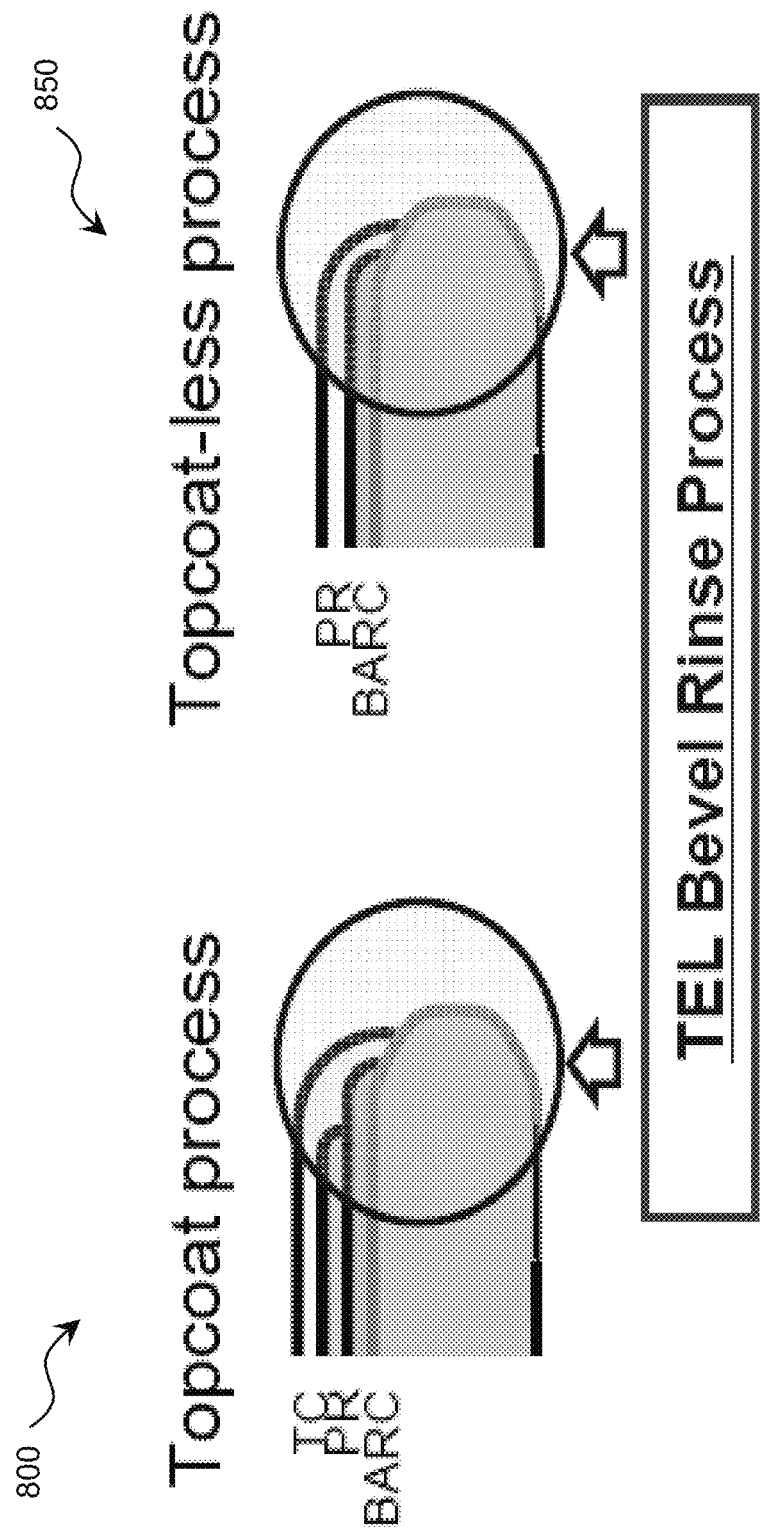
FIG. 8 is a schematic diagram illustrating an bevel rinse process, in accordance with the present disclosure.

Further, FIG. 8 is a schematic diagram illustrating bevel rinse processes utilized by Tokyo Electronic Limited (TEL). A first bevel rinse process 800 includes a topcoat, while another bevel rinse process 850 does not include a top coat. The bevel rinse approach process employed by Tokyo Electronic Limited (TEL) reduced particle defects by about half.

Figure 9:
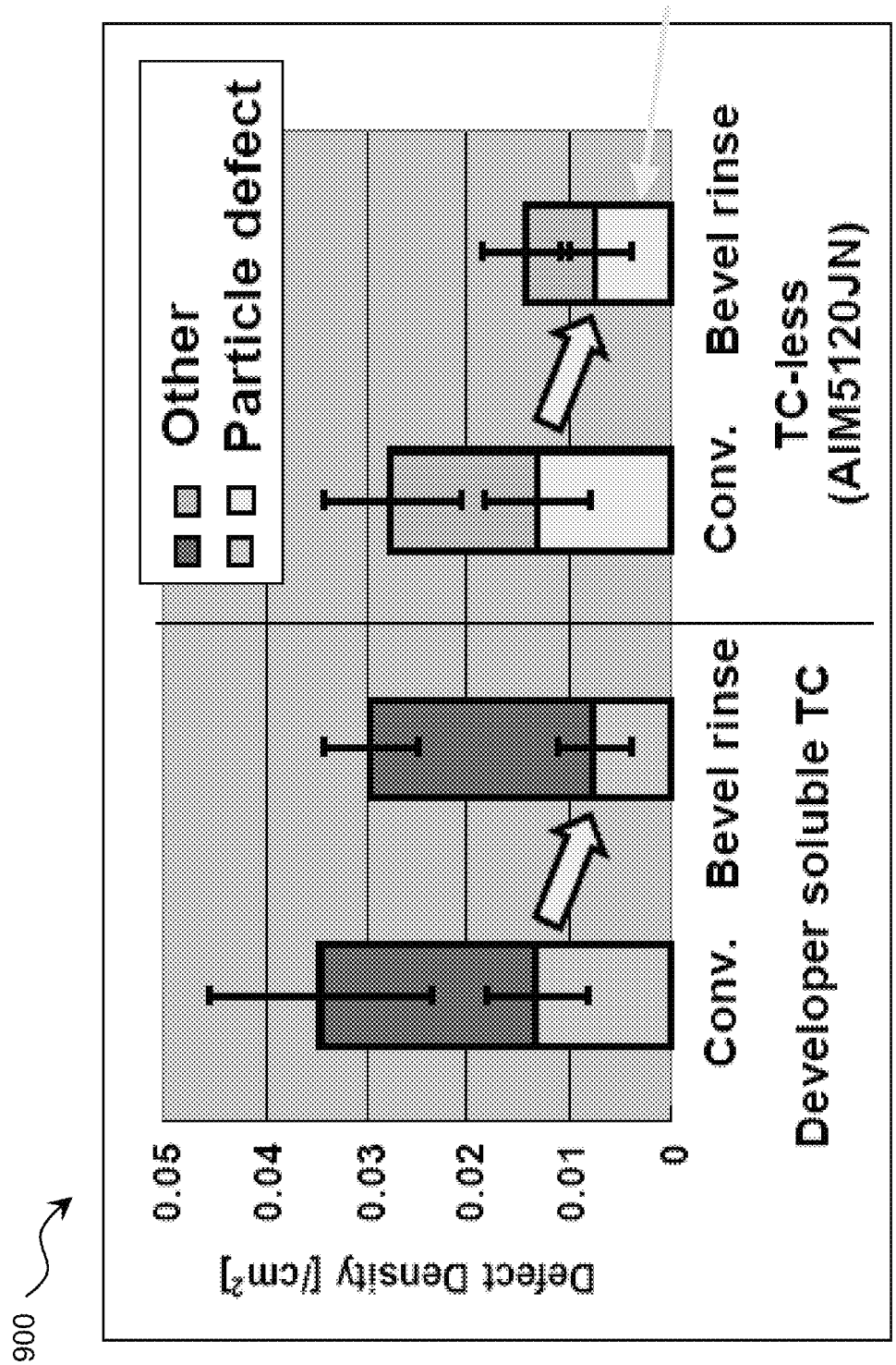
FIG. 9 is a graphical diagram illustrating defect density comparing conventional approaches versus a bevel rinse approach for topcoat and topcoat-less processes, in accordance with the present disclosure.

FIG. 9 is a graphical diagram 900 illustrating defect density comparing conventional approaches versus a bevel rinse approach for topcoat and topcoat-less processes. In both cases—topcoat or no topcoat—the bevel rinse approach dramatically reduces defect density.

Figure 10A:
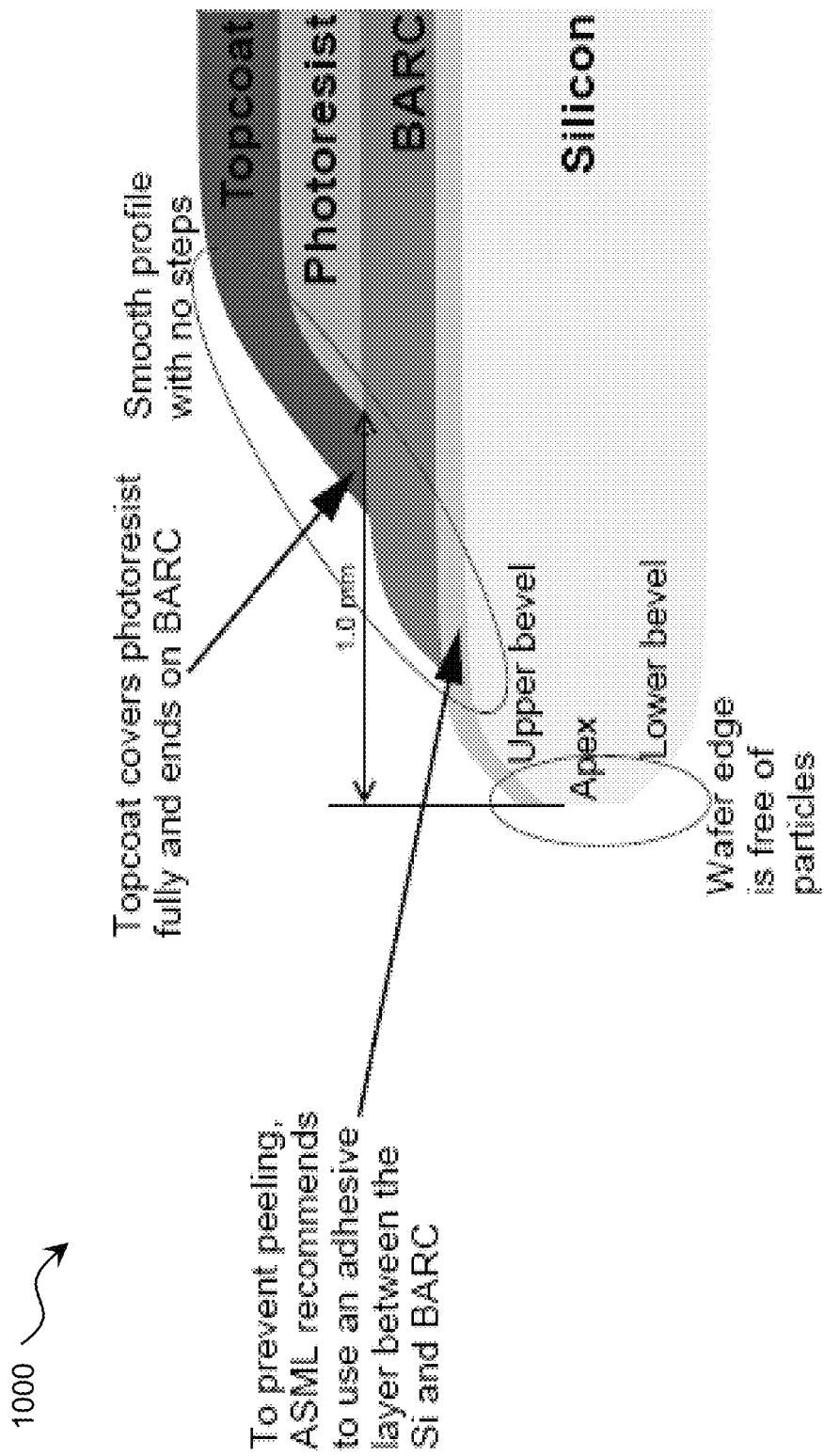
FIGS. 10A, 10B, and 10C are schematic diagrams illustrating edge bead removal (EBR) strategies, in accordance with the present disclosure.
Figure 10B:
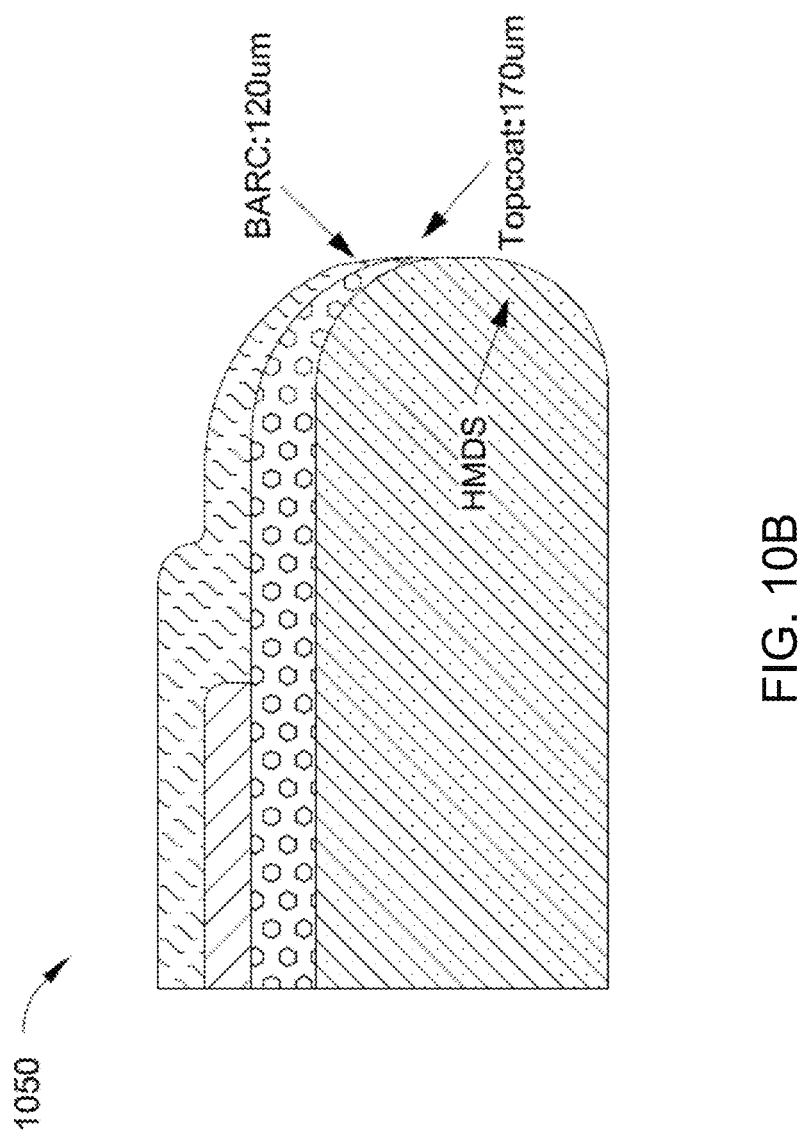
Figure 10C:
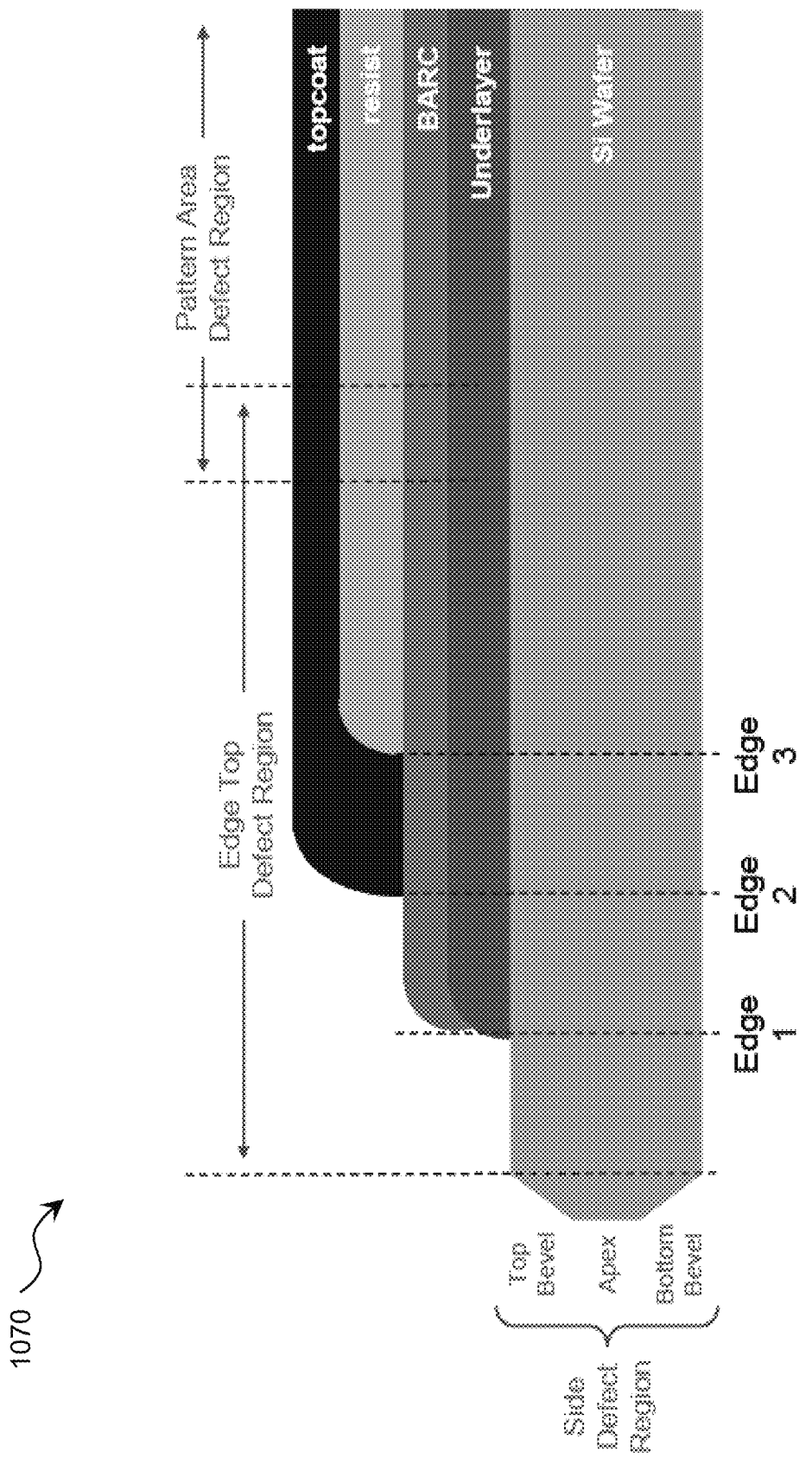

Further, FIGS. 10A, 10B, and 10C are schematic diagrams illustrating edge bead removal (EBR) strategies 1000, 1050, 1070 used by ASML, Hermes Microvision, and IBM respectively. Each strategy 1000, 1050, 1070 utilizes fine measurements and precise profiling to enhance performance and yield. The precision of the wafer edge cut and wafer edge profile are critical both at the immersion lithography stages of wafer manufacturing and during pre-layer profiling.

FIGS. 11A and 11B are schematic diagrams illustrating the potential for wafer asymmetry. In an ideal case 1100, a wafer 1115 has its center coordinates 1116 in alignment with the center coordinates 1106 of a spin table support 1105. When the center coordinates 1116 of the wafer 1115 are in alignment with the center coordinates 1106 of the spin table support 1105, a symmetrical edge results, causing edge bead removal (EBR) cut widths A, B, C, D to be substantially the same for the wafer 1115. In contrast, in a real case 1150, the center coordinates 1166 of a wafer 1165 will often not be in alignment with the center coordinates 1156 of a spin table support 1155. When the center coordinates of the wafer 1165 and the spin table support 1155 are not in alignment, an asymmetrical edge bead removal (EBR) cut width results at the edge of the wafer 1165, i.e., EBR cut widths A, B, C, D are different in the real case 1150.

Figure 12:
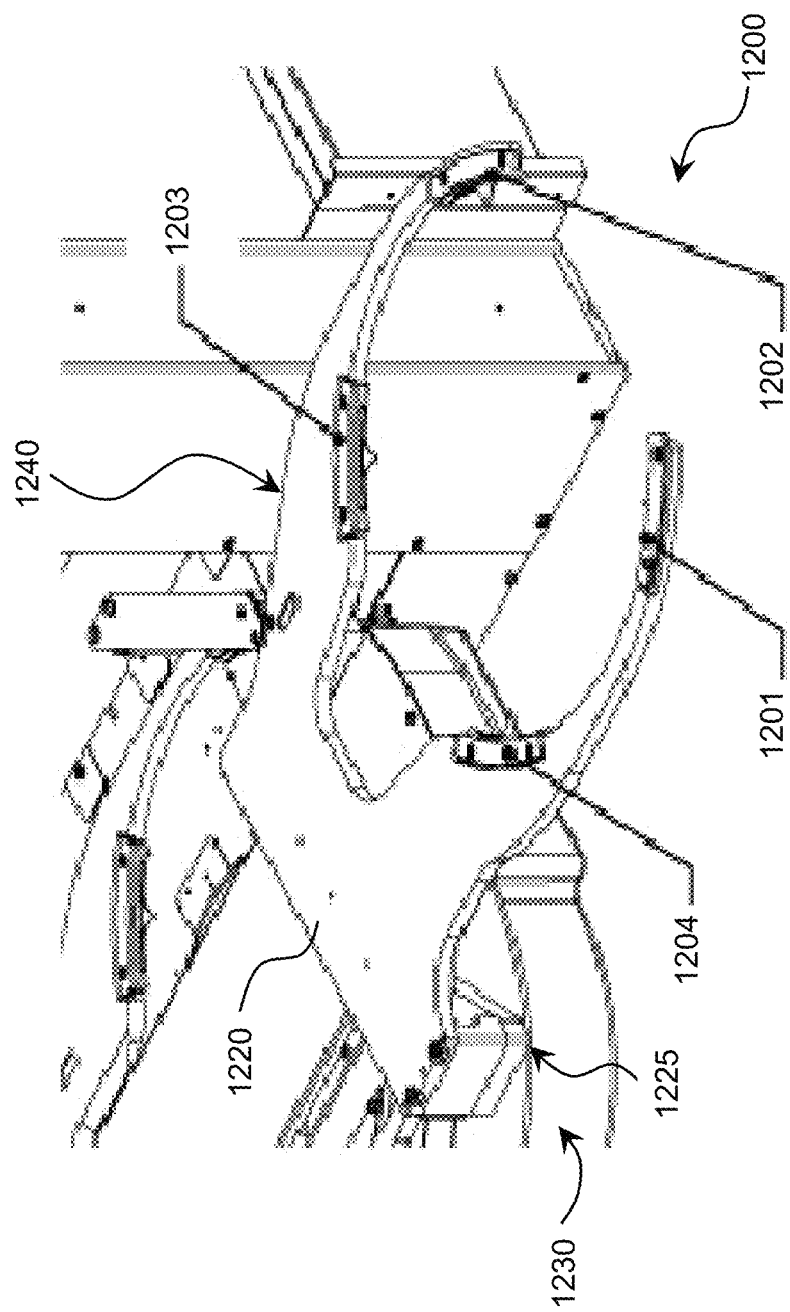
FIG. 12 is a schematic diagram illustrating a wafer arm, in accordance with the present disclosure.

FIG. 12 is a schematic diagram illustrating a wafer arm support 1200 of a spin table system. The wafer arm 1200 is a pivotable, robotic arm for transferring a wafer to and positioning the wafer on a support of a rotatable chuck of a spin table. The arm 1200 includes a base portion 1220 connected to platform 1230 at an axis point 1225. The arm 1200 also includes arm supports 1240 upon which the wafer rests while being transferred to the support of the rotatable chuck of a spin table. The arm supports 1240 include support pin 1201, 1202, 1203, 1204 for securing the safer to the arm supports 1240.

Figure 13:
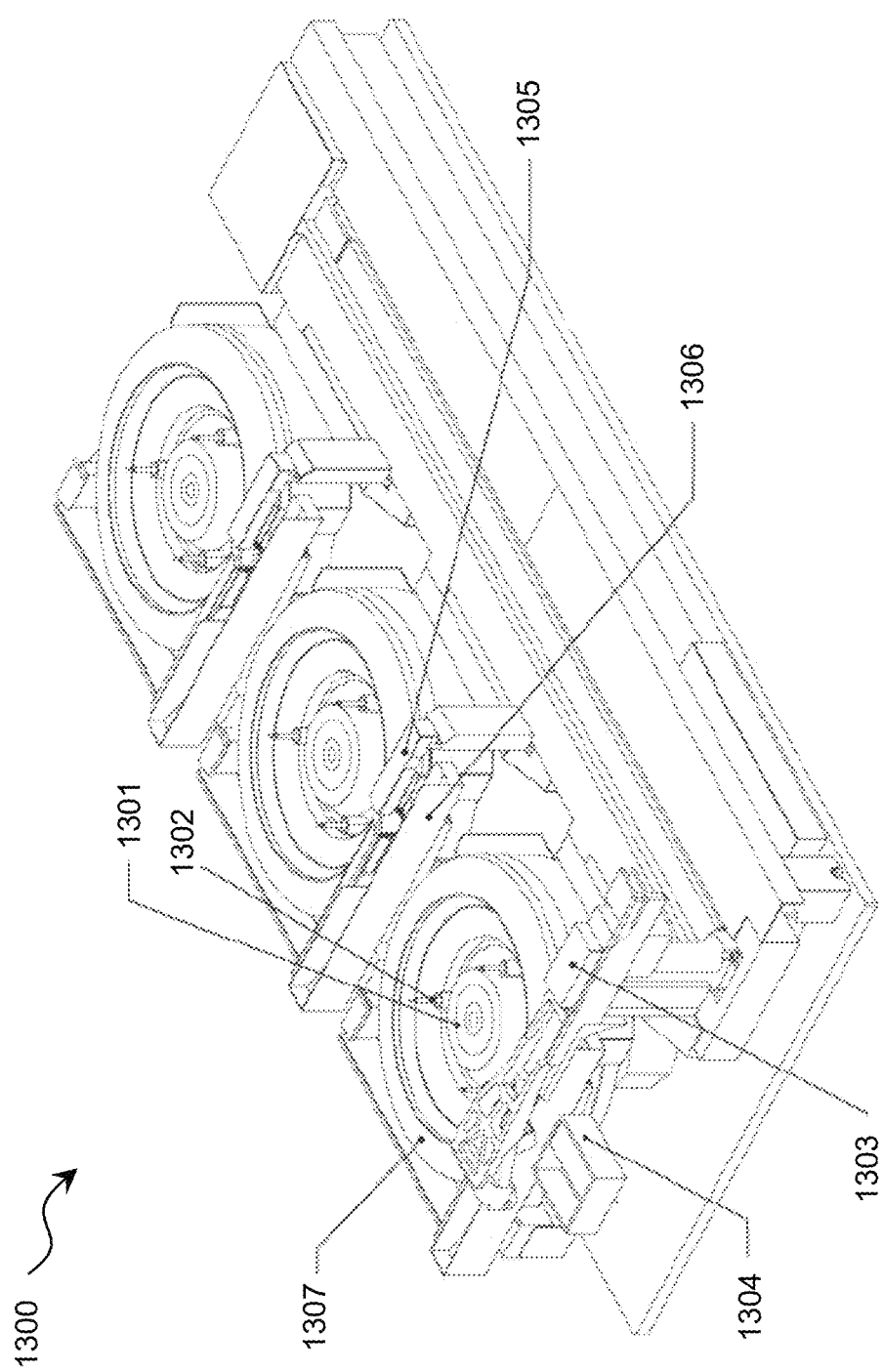
FIG. 13 is a schematic diagram illustrating a spin table, in accordance with the present disclosure.

FIG. 13 is a schematic diagram illustrating a spin table 1300. Spin table 1300 includes a rotatable chuck 1301, wafer support pins 1302, a photo resist arm 1303, a solvent bath reservoir 1304, an edge bead removal (EBR) arm 1305, an edge bead removal (EBR) bath reservoir 1306, and coater cup 1307. The rotatable chuck 1301 is a component that spins a wafer. It spins during photo resist coating, edge bead removal (EBR) processes, back rinse, and cup wash processes. Wafer support pins 1302 support a wafer during wafer transferring to and from a wafer arm. The photo resist arm 1303 moves the photo resist nozzle to a dispense position. Solvent bath reservoir 1304 is a place where photo resist and reduce resist control (RRC) nozzles are positioned when not in use. The solvent bath reservoir contains solvent. Vapor from the solvent prevents the photo resist at the nozzle tip from caking Edge bead removal (EBR) arm 1305 holds and moves the edge bead removal (EBR) nozzle to and from a dispense position. The edge bead removal (EBR) bath reservoir 1306 is the place where the EBR nozzle is positioned when not in use. The coater cup 1307 may be used to collect excess liquids—such as photoresist, edge bead removal liquids, and backside rinse liquids—that fly away from the wafer during spin coating processes and other processes.

Figure 14:
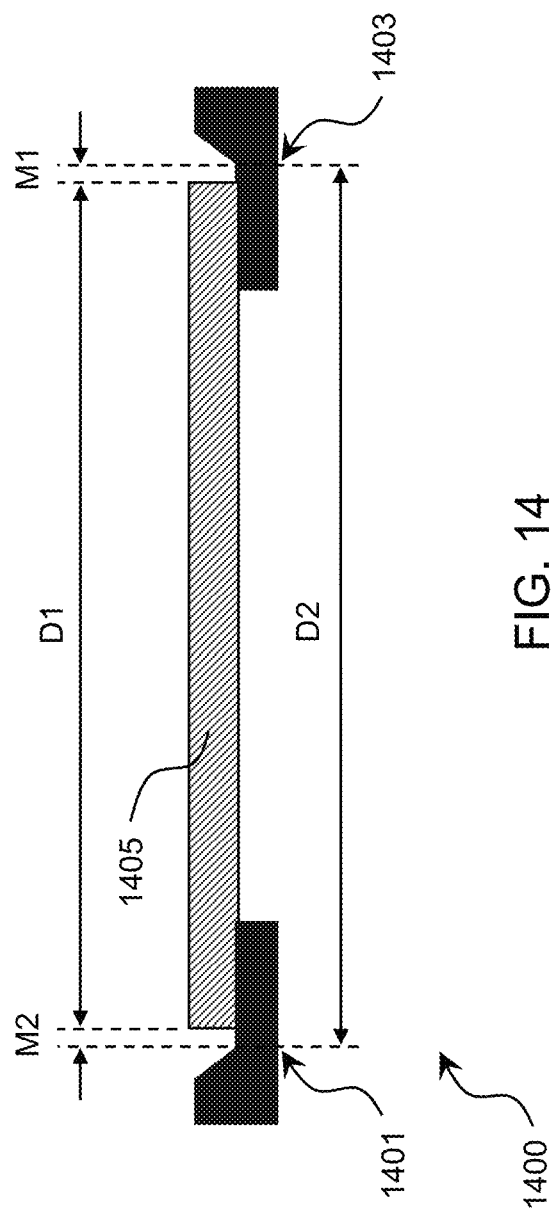
FIG. 14 is a schematic diagram illustrating a cross section of a wafer arm, in accordance with the present disclosure.

FIG. 14 is a schematic diagram illustrating a cross section of a wafer arm support 1400. The wafer 1405 rests on the wafer arm supports near support pin 1401, 1403. The wafer diameter D1 is narrower than a distance D2 between the support pins, which means the wafer 1405 may be positioned anywhere between the support pins, including an asymmetrical placement. The difference between the wafer diameter D1 and the distance D2 between the support pins is shown by margins M1, M2. In some processes, a wafer location may be susceptible to ±0.3 mm deviations between the support pins, depending on margins M1, M2.

Figure 15:
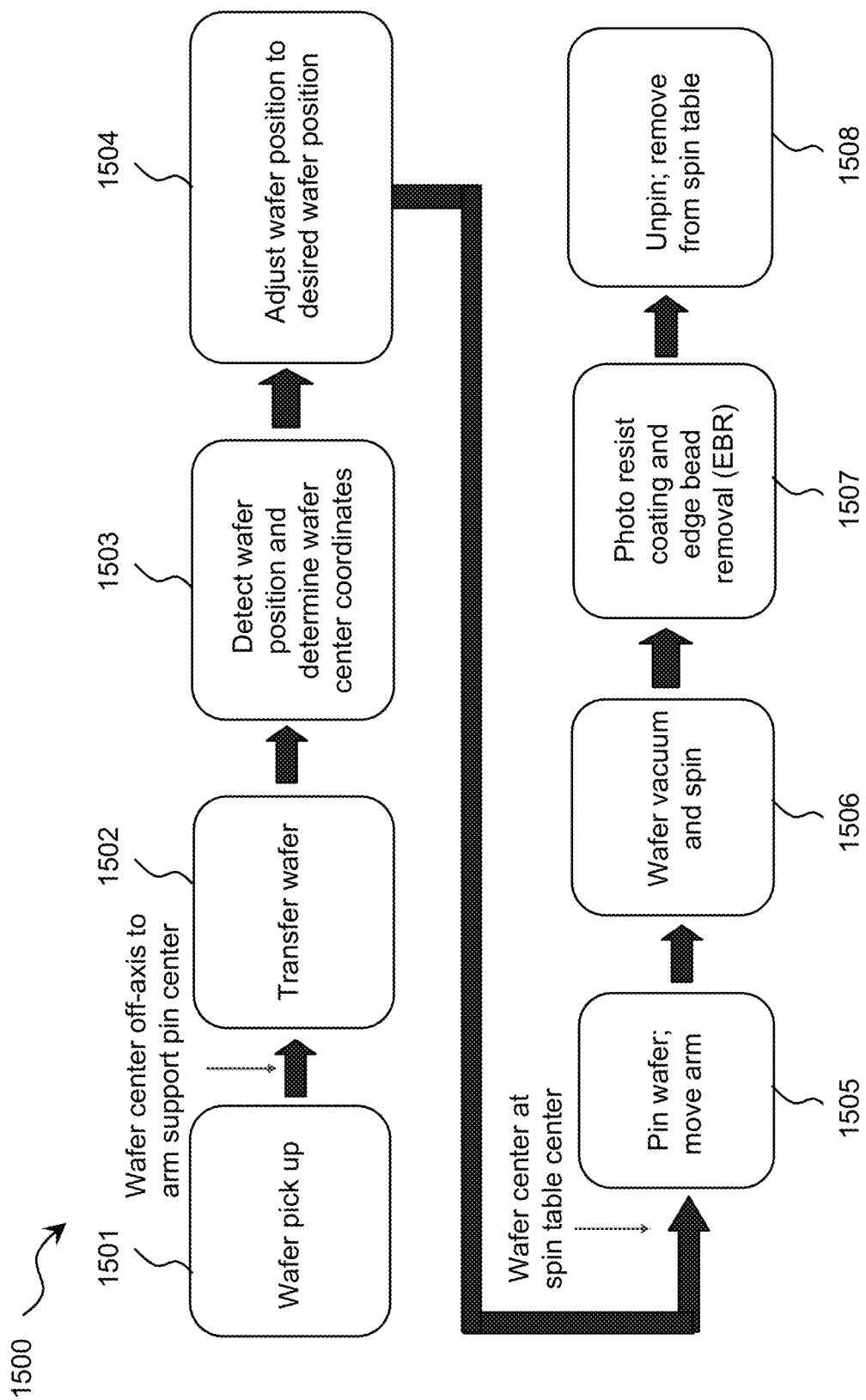
FIG. 15 is a schematic diagram illustrating an approach for edge bead removal (EBR) in accordance with the present disclosure.

FIG. 15 is a schematic diagram illustrating a process 1500 for photo resist coating and edge bead removal (EBR). At action 1501, a wafer is picked up by a wafer arm from a wafer unit. The wafer's center coordinates are off-axis in comparison to the coordinates of the arm support pin center due to a deviation margin between the wafer arm support pins. The wafer arm transfers the wafer to above a spin table's rotatable chuck support at action 1502. At action 1503, the wafer position is determined. Determining wafer position may include determining the position of the wafer's edge and determining the wafer's central coordinates based on the wafer edge position information. The wafer position is adjusted at action 1504 so that the center coordinates of the wafer are in alignment with the center coordinates of the support of the spin table rotatable chuck. The wafer's position is adjusted by adjusting the wafer arm with fine movements in an x and y direction based on the wafer position information. The wafer is pinned at the support of the spin table rotatable chuck at action 1505 and the support arm is moved away from the wafer. At action 1506, the wafer vacuum of the rotatable chuck begins, which holds the wafer in place, and the wafer spin chuck begins spinning. At action 1507, the photo resist coating and edge bead removal process occurs during spinning And at action 1508, the wafer is unpinned from the support of the rotatable chuck of the spin table and the wafer is removed with the wafer arm.

Figure 16:
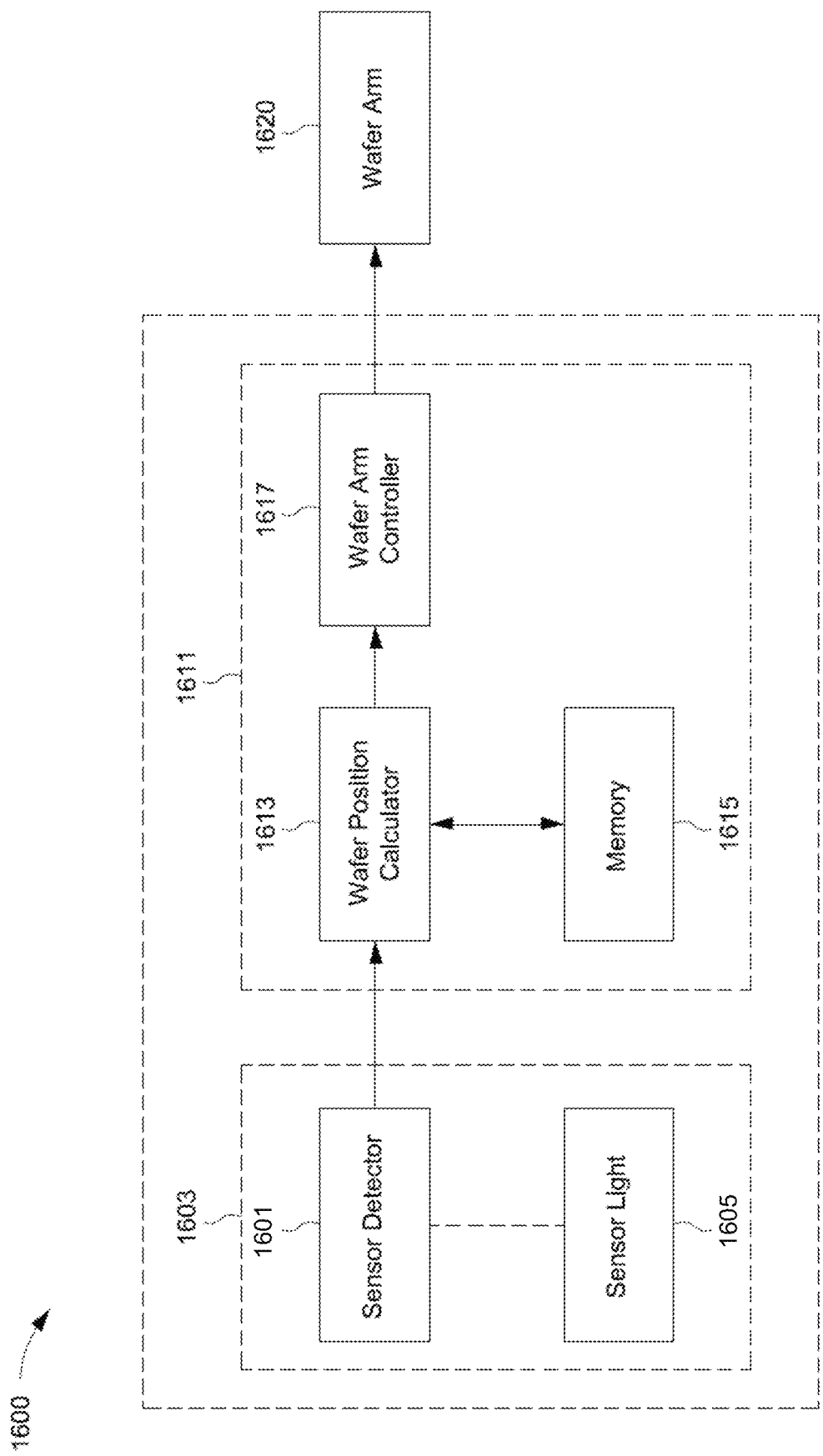
FIG. 16 is a schematic diagram illustrating a system for positioning a wafer on a support of a rotatable chuck, in accordance with the present disclosure.

FIG. 16 is a schematic diagram illustrating a system 1600 for positioning a wafer on a support of a rotatable chuck. The system 1600 may include a wafer position calculator 1613 in communication with a memory storage element 1615. The wafer position calculator may also be in communication with a wafer arm controller 1617. The wafer position calculator may also be in communication with a sensor detector 1601. The wafer arm controller 1617 may also be in communication with a wafer arm 1620. In an embodiment, the sensor light 1605 and sensor detector 1601 are separate physical units, but in other embodiments, the sensor light 1605 and sensor detector 1601 are housed within one physical detector unit 1603 and are used in conjunction with a reflective element (not shown) to determine wafer position information. In an embodiment, the wafer position calculator 1613, memory unit 1615, and wafer arm controller 1617 are separate physical units, but in other embodiments, they are housed within a controller unit 1611. Still, in other embodiments, the detector unit 1603 and the controller unit 1611 are housed together.

The sensor detector 1601 is operable to detect wafer position information and provide that information to the wafer position calculator 1613. The wafer position calculator 1613 is operable to calculate a desired wafer position and provide desired wafer position information to the wafer arm controller 1617. The wafer arm controller 1617 is operable to provide instructions to adjust the wafer arm 1620 to position a wafer on a support of a spin table's rotatable chuck according to the desired wafer position.

The wafer position calculator 1613 may receive wafer position information from the sensor detector 1601 and may determine the wafer's position based on the wafer position information. The wafer position calculator 1613 may retrieve information from the memory 1615 relating to the coordinates of a central axis of the support of the rotatable chuck. The wafer position calculator 1613 may provide the desired wafer position information to the wafer arm controller 1617 in the form of two-dimensional adjustment information. The two-dimensional adjustment information may include $(X_0, Y_0)$-$(X_1, Y_1)$. $(X_0, Y_0)$ represents two-dimensional coordinates of the central axis of the wafer position, and $(X_1, Y_1)$ represents two-dimensional coordinates of a central axis of the support of the rotatable chuck.

Figure 17:
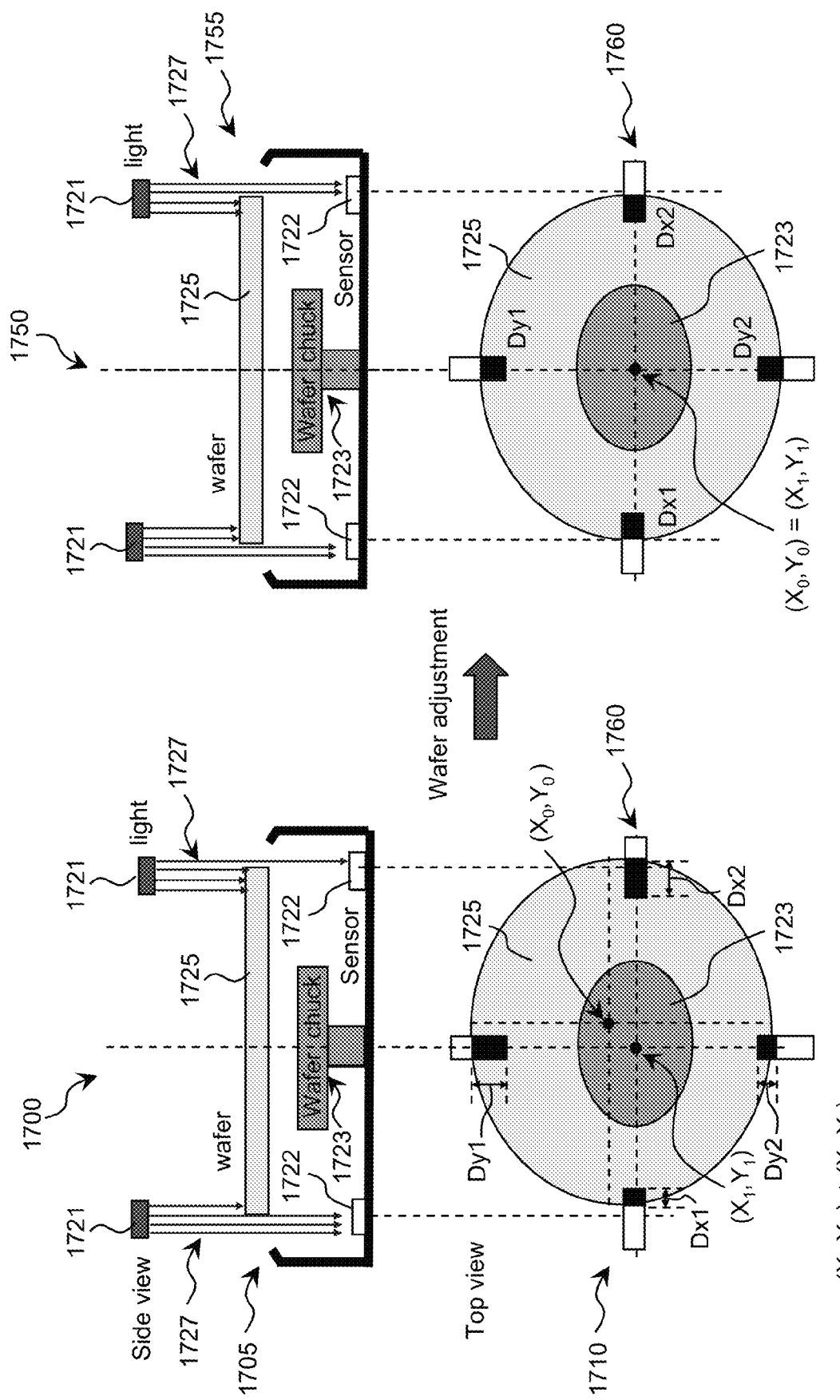
FIG. 17 is a schematic diagram illustrating an apparatus for positioning a wafer on a support of a rotatable chuck, in accordance with the present disclosure.

FIG. 17 is a schematic diagram illustrating before and after views 1700, 1750 of an apparatus for positioning a wafer 1725 on a support 1723 of a rotatable chuck. Both the before view 1700 and after view 1750 include side views 1705 and top town views 1710 of the apparatus.

The apparatus includes one or more sensor lights 1721 and one or more sensor detectors 1722. The sensor detector 1722 is operable to determine wafer position information from a sensor light signal 1727 transmitted by the sensor lights 1721. The sensor detector 1722 is in communication with a wafer position calculator (not shown), and the wafer position calculator is operable to calculate the position of the wafer based on wafer position information received from the sensor detector 1722. In an embodiment, the wafer position calculator calculates distances $Dx_1$, $Dx_2$, $Dy_1$, $Dy_2$ to determine the wafer position information. In an embodiment, sensor lights 1721 emit light at a certain wavelength, and the sensors 1722 detect that certain wavelength of light. The sensor lights 1721 and sensors 1722 may be positioned symmetrically around the center of the spin chuck 1723. When wafers 1725 are loaded onto the spin table, the light emitted from the sensor lights 1721 may be partially blocked and, thus, not detected by the sensors 1722. Thus, $Dx_1$, $Dx_2$, $Dy_1$, $Dy_2$ may represent the blocked portions of the light emitted by the sensor lights 1721. The wafer arm is adjusted until $Dx_1 = Dx_2$ and $Dy_1 = Dy_2$, which indicates that the center coordinates $(X_0, Y_0)$ of the wafer 1725 are in alignment with the center coordinates $(X_1, Y_1)$ of the support 1723.

The wafer position calculator is operable to calculate a desired wafer position based on rotatable chuck coordinate information. The apparatus may further include a wafer arm and a wafer arm controller (not shown). The wafer arm controller is in communication with the wafer position calculator. The wafer arm controller is operable to adjust the wafer arm to position the wafer 1725 with respect to the support 1723. The wafer arm controller may adjust the wafer arm to position a center coordinate $(X_0, Y_0)$ of the wafer 1725 in alignment with a center coordinate $(X_1, Y_1)$ of the support 1723 via fine movements of the arm in the x and y directions. The wafer position calculator provides the desired wafer position information to the wafer arm controller. Thus, the desired wafer position information may include wafer arm adjustments based on the desired wafer position. Once the wafer arm is adjusted, a center coordinate $(X_0, Y_0)$ of the wafer 1725 is in alignment with a center coordinate $(X_1, Y_1)$ of the support 1723 as shown in after view 1750.

Figure 18:
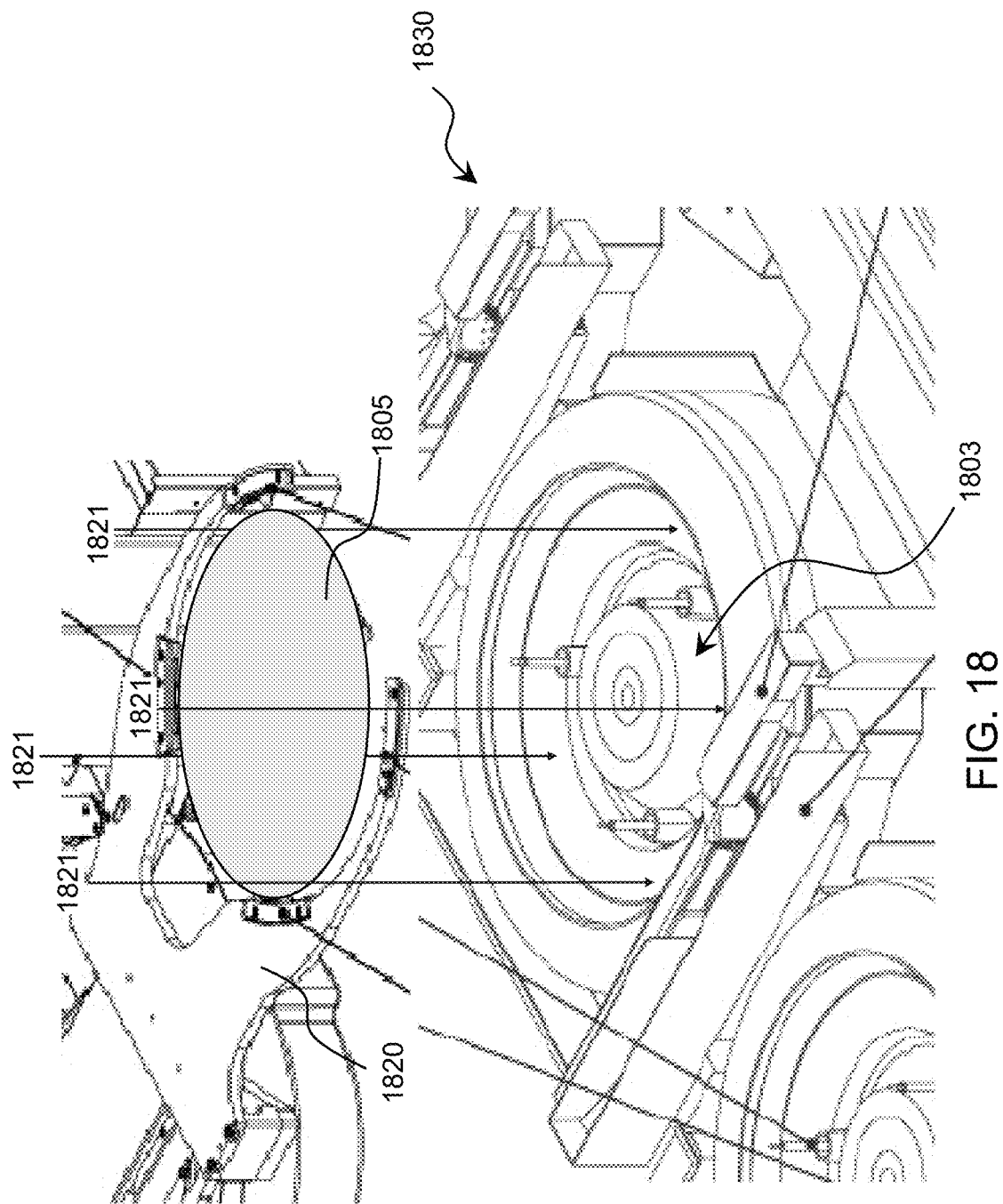
FIG. 18 is a schematic diagram illustrating an apparatus for positioning a wafer on a support of a rotatable chuck, in accordance with the present disclosure.

FIG. 18 is a schematic diagram illustrating an apparatus 1800 for positioning a wafer 1805 on a support of a rotatable chuck 1803 of a spin table 1830. The apparatus 1800 includes a wafer arm 1820 and spin table 1830. The apparatus 1800 further includes one or more sensors 1821 for aligning the wafer 1805 with a support of a rotatable chuck 1803.

Figure 19:
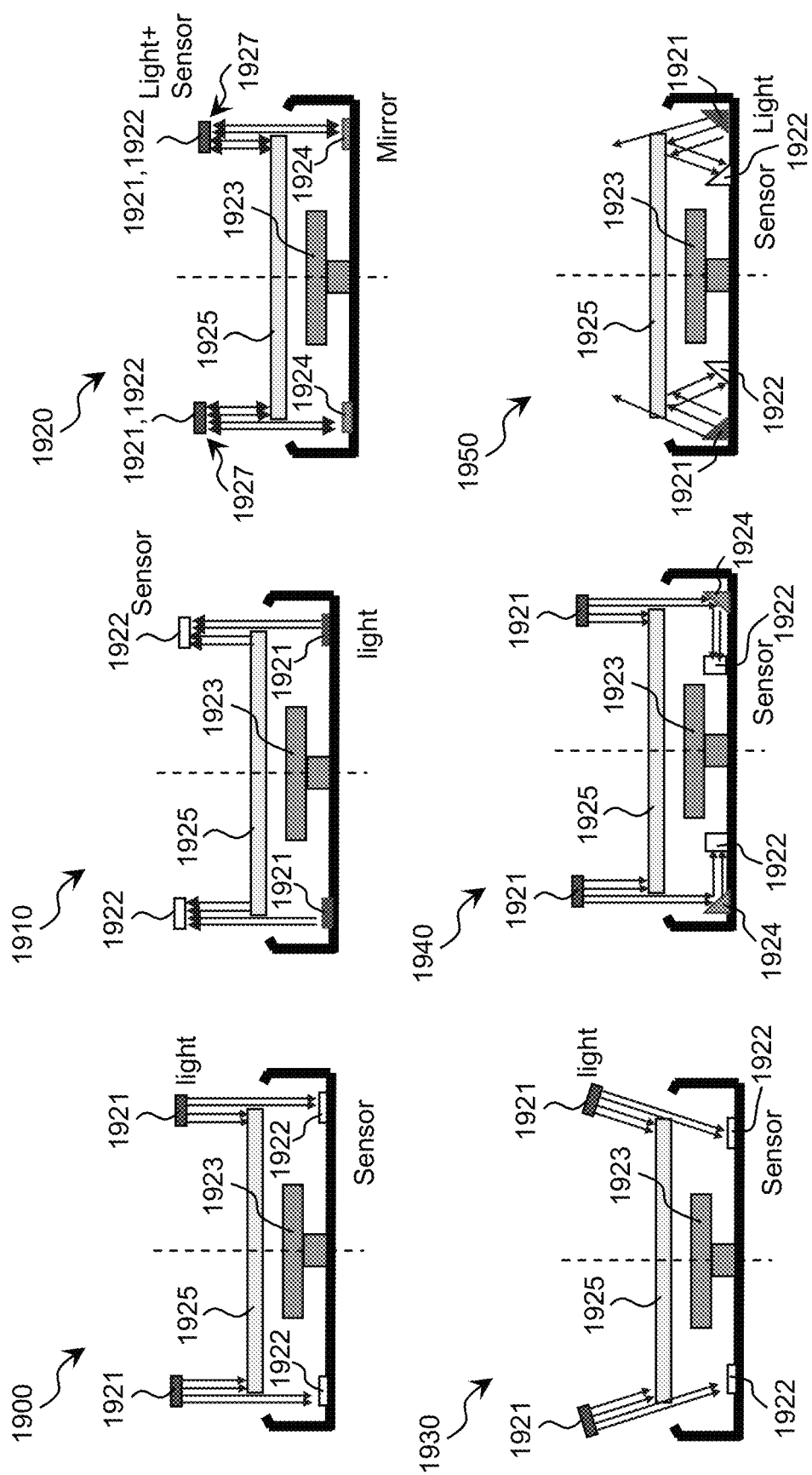
FIG. 19 is a schematic diagram illustrating exemplary sensor positions for an apparatus for positioning a wafer on a support of a rotatable chuck, in accordance with the present disclosure.

FIG. 19 is a schematic diagram illustrating exemplary sensor positions 1900, 1910, 1920, 1930, 1940, 1950 for the apparatuses of FIGS. 17 and 18. In positions 1900, 1920, 1930, 1940, the sensor light is positioned above the wafer 1925 and the support of the rotatable chuck 1923. In positions 1910, 1950, the sensor light is positioned below the wafer 1925 and the support of the rotatable chuck 1923. In position 1920, the light 1921 and sensor 1922 are both positioned above the wafer 1925 and the support of the rotatable chuck 1923.

Thus, in some embodiments, the sensor light 1921 is positioned opposite the support 1923 from the sensor detector 1922, while in other embodiments, the sensor light 1921 is positioned on the same side of the support 1923 as the sensor detector 1922.

In some embodiments, the sensor detector and sensor light are housed within a detector unit 1927 (e.g., position 1920). Those embodiments may also include a mirror 1924 positioned opposite the support from the detector unit 1927. The mirror 1924 is operable to reflect light produced by the sensor light back to the sensor detector both housed in the detector unit 1927.

Further, some embodiments may rely on the reflective properties of the back side of the wafer 1925. The sensor detector 1922 and the sensor light 1921 may be positioned beneath the wafer 1925 and may utilize the reflective properties of the back side of the wafer 1925 to determine the position of the wafer 1925.

Some embodiments may rely on a reflective element or mirror 1924 positioned beneath the sensor light 1921 and next to the sensor 1922—forming a right angle with the sensor light 1921 and sensor 1922 (e.g., position 1940). The mirror 1924 is operable to reflect light produced by the sensor light 1921 to the sensor detector 1922.

Sensor lights 1921 and sensor detectors 1922 may be positioned in vertical alignment (e.g., positions 1900, 1910), at right angles from each other (e.g., position 1940), in horizontal alignment (e.g., position 1950), or at another angle (e.g., position 1930). The sensor lights 1921 may be directed in an angle that can be received by the sensor detectors 1922 so as to determine the position of the wafer 1925 with respect to the table 1923 in accordance with the principles discussed above.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. An apparatus for positioning a wafer on a support of a rotatable chuck, the apparatus comprising:
   a plurality of sensor lights positioned symmetrically around a center coordinate of the rotatable chuck;
   a plurality of sensor detectors positioned symmetrically around the center coordinate of the rotatable chuck, the sensor detectors in communication with the sensor lights and operable to determine wafer position information relative to the center coordinate of the rotatable chuck when the wafer is positioned on the rotatable chuck;
   a wafer arm; and
   a wafer arm controller, wherein the wafer arm controller is operable to adjust the wafer arm to position a center coordinate of the wafer in alignment with the center coordinate of the rotatable chuck when the wafer is positioned on the rotatable chuck based on the wafer position information determined by the sensor detectors.

2. The apparatus of claim 1, further comprising a wafer position calculator in communication with the sensor detectors, wherein the wafer position calculator is operable to calculate the position of the wafer based on wafer position information received from the sensor detectors.

3. The apparatus of claim 2, wherein the wafer position calculator is further operable to calculate a desired wafer position based on rotatable chuck coordinate information.

4. The apparatus of claim 3, wherein:
   the wafer arm controller is in communication with the wafer position calculator, wherein the wafer arm controller is operable to adjust the wafer arm to position the wafer with respect to the support.

5. The apparatus of claim 4, wherein the wafer arm controller is operable to adjust the wafer arm to position a center coordinate of the wafer in alignment with a center coordinate of the support.

6. The apparatus of claim 4, wherein the wafer position calculator provides desired wafer position information to the wafer arm controller.

7. The apparatus of claim 6, wherein the desired wafer position information comprises wafer arm adjustments based on the desired wafer position.

8. The apparatus of claim 1, wherein the sensor lights are positioned opposite the support from the sensor detectors.

9. The apparatus of claim 1, wherein the sensor lights are positioned on the same side of the support as the sensor detectors.

10. The apparatus of claim 1, wherein each sensor detector and its corresponding sensor light are housed within a single sensor unit, and further comprising a mirror positioned opposite the support of the rotatable chuck from the single sensor unit, wherein the mirror is operable to reflect light produced by each sensor light to its corresponding sensor detector.

11. The apparatus of claim 1, wherein each of the sensor light and sensor detector pairs are positioned symmetrically around the center coordinate of the rotatable chuck in such a way as to allow at least a portion of the light irradiated from the sensor light to be directly received by its corresponding sensor detector when the center coordinate of the wafer is in alignment with the center coordinate of the rotatable chuck.

12. A method for positioning a wafer on a support of a rotatable chuck, the method comprising:
   receiving wafer position information from a plurality of sensor detectors positioned symmetrically around a center coordinate of the rotatable chuck when the wafer is positioned on the rotatable chuck;
   determining wafer position relative to a center coordinate of the rotatable chuck when the wafer is positioned on the rotatable chuck based on the wafer position information; and
   adjusting, by a wafer arm controller, a wafer arm to position a center coordinate of the wafer in alignment with a center coordinate of the rotatable chuck when the wafer is positioned on the rotatable chuck based on the determined wafer position information.

13. The method of claim 12, further comprising:
   providing instructions for a wafer arm controller to pick up the wafer;
   providing instructions for the wafer arm controller to transfer the wafer to a position above the support of the rotatable chuck; and
   providing instructions for the wafer arm controller to lower the wafer onto the support.

14. The method of claim 13, further comprising:
   providing instructions for securing the wafer to the support with support pins;
   initiating a photo resist coating process;
   initiating an edge bevel rinse process; and providing instructions for the wafer arm controller to remove the wafer from the support.

15. The method of claim 14, wherein the wafer position calculator is operable to calculate the position of the wafer based on wafer position information received from the sensor detectors.

16. The method of claim 12, wherein calculating the desired wafer position comprises determining desired coordinates of a central axis of the wafer.

17. The method of claim 12, wherein providing desired wafer position information comprises providing two-dimensional adjustment information.

18. The method of claim 17, wherein the two-dimensional adjustment information comprises $(X_0,Y_0)$-$(X_1,Y_1)$, wherein $(X_0,Y_0)$ is a two-dimensional representation of coordinates of a central axis of the wafer position, and wherein $(X_1,Y_1)$ is a two-dimensional representation of central coordinates of a central axis of the support of the rotatable chuck.

19. The method of claim 12, wherein each of the sensor detectors are positioned symmetrically around the center coordinate of the rotatable chuck in such a way as to allow at least a portion of light irradiated from a corresponding sensor light of the sensor detector to be directly received by the sensor detector when the center coordinate of the wafer is in alignment with the center coordinate of the rotatable chuck.

20. A system for positioning a wafer on a support of a rotatable chuck, the system comprising:
   a plurality of sensor detectors positioned symmetrically around a center coordinate of the rotatable chuck, the plurality of sensor detectors operable to determine wafer position information relative to a center coordinate of the rotatable chuck when the wafer is positioned on the rotatable chuck, and
   a wafer arm controller operable to adjust a wafer arm to position a center coordinate of the wafer in alignment with a center coordinate of the rotatable chuck when the wafer is positioned on the rotatable chuck based on the determined wafer position information.

21. The system of claim 20, further comprising a wafer arm controller in communication with the wafer position calculator, the wafer arm controller operable to provide instructions to adjust a wafer arm to position the wafer on the support according to the desired wafer position.

22. The system of claim 21, further comprising:
   a plurality of sensor lights positioned symmetrically around the center coordinate of the rotatable chuck,
   wherein the sensor detectors are in communication with the wafer position calculator, and wherein the sensor detectors provide wafer position information to the wafer position calculator.

23. The system of claim 20, wherein the wafer position calculator may receive wafer position information from the sensor detectors, and wherein the wafer position calculator is operable to determine wafer position based on the wafer position information, and wherein the desired wafer position information provided to the wafer arm controller comprises two-dimensional adjustment information.

24. The system of claim 23, wherein the two-dimensional adjustment information comprises $(X_0,Y_0)$-$(X_1,Y_1)$, wherein $(X_0,Y_0)$ is a two-dimensional representation of coordinates of a central axis of the wafer position, and wherein $(X_1,Y_1)$ is a two-dimensional representation of central coordinates of a central axis of the support of the rotatable chuck.

25. The system of claim 20, wherein each of the sensor detectors are positioned symmetrically around the center coordinate of the rotatable chuck in such a way as to allow at least a portion of light irradiated from a corresponding sensor light of the sensor detector to be directly received by the sensor detector when the center coordinate of the wafer is in alignment with the center coordinate of the rotatable chuck.

\* \* \* \* \*